(12) United States Patent
Kim et al.

(10) Patent No.: US 9,384,973 B2
(45) Date of Patent: Jul. 5, 2016

(54) METHODS OF FORMING SEMICONDUCTOR FILMS AND METHODS OF MANUFACTURING TRANSISTORS INCLUDING SEMICONDUCTOR FILMS

(71) Applicant: Samsung Electronics Co., Ltd., Suwon-Si, Gyeonggi-Do (KR)

(72) Inventors: Tae-sang Kim, Seoul (KR); Jong-baek Seon, Yongin-si (KR); Myung-kwan Ryu, Yongin-si (KR); Chil Hee Chung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/293,187

(22) Filed: Jun. 2, 2014

(65) Prior Publication Data

US 2015/0064860 A1 Mar. 5, 2015

(30) Foreign Application Priority Data

Aug. 29, 2013 (KR) .................. 10-2013-0103430

(51) Int. Cl.
*H01L 21/02* (2006.01)
*H01L 29/66* (2006.01)
*H01L 29/786* (2006.01)

(52) U.S. Cl.
CPC ...... *H01L 21/02521* (2013.01); *H01L 21/0262* (2013.01); *H01L 21/02554* (2013.01); *H01L 21/02631* (2013.01); *H01L 29/66742* (2013.01); *H01L 29/786* (2013.01)

(58) Field of Classification Search
CPC .............. H01L 21/02521; H01L 21/02554; H01L 21/02631; H01L 21/0262; H01L 29/786; H01L 29/66742
USPC ................................ 438/197; 257/43, 57, 63
See application file for complete search history.

(56) References Cited

U.S. PATENT DOCUMENTS

| 4,376,688 A * | 3/1983 | Ceasar ................. C23C 14/46 136/258 |
| 7,601,984 B2 | 10/2009 | Sano et al. |
| 7,994,508 B2 | 8/2011 | Ye |
| 2008/0264777 A1* | 10/2008 | Ye .................... C23C 14/0036 204/192.25 |
| 2011/0175082 A1 | 7/2011 | Kim et al. |
| 2012/0208358 A1* | 8/2012 | Roca I Cabarrocas ....... H01L 21/02381 438/509 |
| 2014/0014943 A1* | 1/2014 | Ting ................ H01L 21/02554 257/43 |

FOREIGN PATENT DOCUMENTS

| KR | 100968137 B1 | 5/2010 |
| KR | 101096079 B1 | 12/2011 |

* cited by examiner

*Primary Examiner* — Kevin M Picardat
*Assistant Examiner* — James Chin
(74) *Attorney, Agent, or Firm* — Harness, Dickey & Pierce, P.L.C.

(57) ABSTRACT

Provided are semiconductor films, methods of forming the same, transistors including the semiconductor films, and methods of manufacturing the transistors. Provided are a semiconductor film including zinc (Zn), nitrogen (N), oxygen (O), and fluorine (F), and a method of forming the semiconductor film. Provided are a semiconductor film including zinc, nitrogen, and fluorine, and a method of forming the semiconductor film. Sputtering, ion implantation, plasma treatment, chemical vapor deposition (CVD), or a solution process may be used in order to form the semiconductor films. The sputtering may be performed by using a zinc target and a reactive gas including fluorine. The reactive gas may include nitrogen and fluorine, or nitrogen, oxygen, and fluorine.

7 Claims, 21 Drawing Sheets

METHODS OF FORMING SEMICONDUCTOR FILMS AND METHODS OF MANUFACTURING TRANSISTORS INCLUDING SEMICONDUCTOR FILMS

RELATED APPLICATIONS

This application claims priority from Korean Patent Application No. 10-2013-0103430, filed on Aug. 29, 2013, in the Korean Intellectual Property Office, the disclosure of which is incorporated herein in its entirety by reference.

BACKGROUND

1. Field

At least one example embodiment of the present disclosure relates to semiconductor films, methods of forming the same, transistors including semiconductor films, and/or methods of manufacturing the transistors.

2. Description of the Related Art

Transistors are widely used as switching devices or as driving devices in electronic devices. In particular, because a thin film transistor (TFT) may be manufactured on a glass substrate or a plastic substrate, TFTs are typically used in display apparatuses such as organic light-emitting display apparatuses or liquid crystal display apparatuses. The performance of a TFT may mostly depend on properties of a channel layer (semiconductor layer).

Most commercially available display devices typically use a TFT including a channel layer formed of amorphous silicon (hereinafter, referred to as an amorphous silicon TFT), or a TFT including a channel layer formed of polycrystalline silicon (hereinafter, referred to as a polycrystalline silicon TFT). An amorphous silicon TFT presents a disadvantage in that since a charge mobility is typically about 0.5 $cm^2/Vs$, which is typically considered to be low, it is difficult to increase an operating speed of a display apparatus using the amorphous silicon TFT. A polycrystalline silicon TFT presents a disadvantage in that because crystallization, impurity doping, and activation processes are required, the manufacturing process of a polycrystalline silicon TFT is more complex, and manufacturing costs are typically higher than for an amorphous silicon TFT. Also, the polycrystalline silicon TFT presents a disadvantage in that, because it is difficult to ensure uniformity of a polycrystalline silicon layer, image quality is reduced when the polycrystalline silicon layer is used as a channel layer of a large-size display apparatus.

In order to realize a next generation high-performance/high-resolution/large-size display apparatus, a TFT having excellent performance is desired. In this regard, research has been conducted on an oxide TFT using an oxide semiconductor having a high carrier mobility as a material for a channel layer. However, a conventional oxide TFT may not ensure excellent switching characteristics (ON/OFF characteristics) and high reliability. Accordingly, there is a demand for a channel layer material (semiconductor) for manufacturing a transistor (TFT) having high mobility, excellent switching characteristics, and high reliability.

SUMMARY

At least one example embodiment includes semiconductor films having excellent properties, and/or methods of forming the same.

Provided are semiconductor films that may improve the performance and reliability of transistors, and methods of forming the semiconductor films.

At least one example embodiment includes transistors using the semiconductor films, and/or methods of manufacturing the transistors.

At least one example embodiment includes transistors having a high mobility and excellent switching characteristics, and/or methods of manufacturing the transistors.

Additional aspects will be set forth in part in the description which follows and, in part, will be apparent from the description, or may be learned by practice of the presented example embodiments.

According to at least one example embodiment, a method of forming a semiconductor film by using reactive sputtering includes forming the semiconductor film including zinc (Zn), nitrogen (N), and fluorine (F) by using a zinc target and a reactive gas including nitrogen and fluorine.

The semiconductor film may include zinc fluoronitride.

The reactive gas may further include oxygen (O), and the semiconductor film may include zinc fluoro-oxynitride.

The reactive gas may include a fluorine-containing gas, and the fluorine-containing gas may include at least one of $F_2$, $NF_3$, $SF_6$, and $CF_4$.

The reactive gas may include a nitrogen-containing gas, and the nitrogen-containing gas may include at least one of $N_2$, $N_2O$, and $NH_3$.

The reactive gas may include an oxygen-containing gas, and the oxygen-containing gas may include at least one of $O_2$, $H_2O$, and $N_2O$.

The semiconductor film may have a Hall mobility equal to or greater than about 10 $cm^2/Vs$.

The semiconductor film may have a Hall mobility equal to or greater than about 20 $cm^2/Vs$.

According to another example embodiment, a method of manufacturing a transistor including a channel layer including a semiconductor, a gate electrode being spaced apart from the channel layer, and a source and a drain respectively contacting first and second regions of the channel layer includes forming the channel layer, the forming the channel layer including forming the semiconductor film by using the method discussed above.

The transistor may have a field-effect mobility equal to or greater than about 10 $cm^2/Vs$.

The transistor may have a field-effect mobility equal to or greater than about 20 $cm^2/Vs$.

The transistor may have a sub-threshold swing value equal to or less than about 0.95 V/dec.

The transistor may have a sub-threshold swing value equal to or less than about 0.75 V/dec.

According to another example embodiment, a method of forming a semiconductor film includes forming a first material film that includes zinc (Zn) and nitrogen (N), and forming a fluorine (F)-containing semiconductor film by adding fluorine into the first material film.

The first material film may include zinc nitride. In this case, the semiconductor film may include zinc fluoronitride.

The first material film may include zinc oxynitride. In this case, the semiconductor film may include zinc fluoro-oxynitride.

The adding of the fluorine into the first material film may include ion-implanting the fluorine into the first material film.

A source of the fluorine may include $F_2$ gas.

The adding of the fluorine into the first material film may include treating the first material film with plasma of a gas including fluorine.

The gas including the fluorine may include at least one of $F_2$, $NF_3$, $SF_6$, and $CF_4$.

According to another example embodiment, a method of manufacturing a transistor including a channel layer including a semiconductor, a gate electrode being spaced apart from the channel layer, and a source and a drain respectively contacting first and second regions of the channel layer includes forming the channel layer, the forming the channel layer including forming the semiconductor film by using the method discussed above.

According to another example embodiment, a method of forming a semiconductor film by using chemical vapor deposition (CVD) includes forming the semiconductor film including zinc (Zn), nitrogen (N), and fluorine (F) by using a precursor of zinc and a reactive gas including nitrogen and fluorine.

The semiconductor film may include zinc fluoronitride.

The reactive gas may further include oxygen (O), and the semiconductor film may include zinc fluoro-oxynitride.

The semiconductor film may be formed by using metal organic chemical vapor deposition (MOCVD).

The reactive gas may include a fluorine-containing gas. The fluorine-containing gas may include at least one of $F_2$, $NF_3$, $SF_6$, and $CF_4$.

The reactive gas may include a nitrogen-containing gas. The nitrogen-containing gas may include at least one of $N_2$, $N_2O$, and $NH_3$.

The reactive gas may include an oxygen-containing gas. The oxygen-containing gas may include at least one of $O_2$, $H_2O$, and $N_2O$.

According to another example embodiment, a method of manufacturing a transistor including a channel layer including a semiconductor, a gate electrode being spaced apart from the channel layer, and a source and a drain respectively contacting first and second regions of the channel layer includes forming a channel layer, the forming the channel layer including forming the semiconductor film by using the method discussed above.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
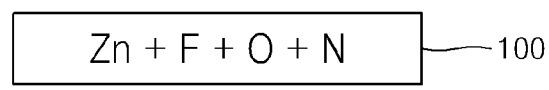
FIG. 1 is a cross-sectional view illustrating a semiconductor film according to an example embodiment.

Various example embodiments will now be described more fully with reference to the accompanying drawings in which example embodiments are shown.

It will be understood that when an element is referred to as being "on," "connected" or "coupled" to another element, it can be directly on, directly connected or coupled to the other element or intervening elements may be present. In contrast, when an element is referred to as being "directly on," "directly connected" or "directly coupled" to another element, there are no intervening elements present. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings. Widths and thicknesses of layers or regions illustrated in the drawings are exaggerated for clarity. The same reference numerals denote the same elements throughout.

In the drawing figures, the dimensions of layers and regions may be exaggerated for clarity of illustration. Like reference numerals refer to like elements throughout. The same reference numbers indicate the same components throughout the specification.

FIG. 1 is a cross-sectional view illustrating a semiconductor film 100 according to at least one example embodiment. The semiconductor film 100 may be a thin film. The semiconductor film 100 may be a compound or may include a compound. In this regard, the semiconductor film 100 may be referred to as a "compound semiconductor film" or a "semiconductor film including compound."

Referring to FIG. 1, the semiconductor film 100 may include zinc (Zn), fluorine (F), oxygen (O), and nitrogen (N). That is, the semiconductor film 100 may include a compound composed of zinc, fluorine, oxygen, and nitrogen. The compound composed of zinc, fluorine, oxygen, and nitrogen may be or include a quaternary compound. The quaternary compound may be zinc fluorooxynitride ($ZnF_xO_yN_z$ or $ZnO_xN_yF_z$). Accordingly, the semiconductor film 100 may include zinc fluorooxynitride. In other words, the semiconductor film 100 may include fluorine-containing zinc oxynitride. The fluorine-containing zinc oxynitride may be zinc fluorooxynitride. In other words, the semiconductor film 100 may be a zinc compound semiconductor, and the zinc compound semiconductor may include fluorine, oxygen, and nitrogen. The semiconductor film 100 may be an inorganic compound semiconductor.

In the semiconductor film 100, a content ratio of fluorine to the sum of nitrogen, oxygen, and fluorine, that is, $[F/(N+O+F)]\times 100$, may be equal to or greater than, for example, about 3 at % or about 5 at %. The content ratio of fluorine may range from about 3 at % to about 35 at % or from about 5 at % to about 35 at %. Alternatively, the content ratio of fluorine may range from about 3 at % to about 25 at % or from about 5 at % to about 25 at %. In the semiconductor film 100, a content ratio of nitrogen to the sum of nitrogen, oxygen, and fluorine, that is, $[N/(N+O+F)]\times 100$, may be equal to or greater than, for example, about 50 at % or about 60 at %. The content ratio of nitrogen may range from about 55 at % to about 95 at % or from about 70 at % to about 95 at %. Alternatively, the content ratio of nitrogen may range from about 60 at % to about 90 at %. In the semiconductor film 100, a content ratio of oxygen to the sum of nitrogen, oxygen, and fluorine, that is, $[O/(N+O+F)]\times 100$, may be equal to or less than, for example, about 40 at %. The content ratio of oxygen may range from about 2 at % to about 35 at % or from about 5 at % to about 30 at %.

The semiconductor film 100 may have a Hall mobility equal to or greater than about 10 $cm^2/Vs$, or equal to or greater than about 20 $cm^2/Vs$, or equal to or greater than about 30 $cm^2/Vs$. According to a condition for forming the semiconductor film 100, the Hall mobility of the semiconductor film 100 may be increased to 100 $cm^2/Vs$ or more. For example, the Hall mobility of the semiconductor film 100 may range from about 10 $cm^2/Vs$ to about 120 $cm^2/Vs$. A carrier density of the semiconductor film 100 may range, for example, from about $10^{11}/cm^3$ to about $10^{18}/cm^3$, or from about $10^{12}/cm^3$ to about $10^{17}/cm^3$. Since a conductivity type of the semiconductor film 100 may be an n-type, the term "carrier density" may refer to a concentration of electrons, and may be represented with a negative (−) sign. For convenience, herein, the carrier density (electron concentration) is expressed in a positive (+) value (without a negative sign). Meanwhile, a resistivity $\rho$ of the semiconductor film 100 may range, for example, from about 0.01 $\Omega\cdot cm$ to about $10^6$ $\Omega\cdot cm$, or from about 0.01 $\Omega\cdot cm$ to about $10^5$ $\Omega\cdot cm$. Properties of the semiconductor film 100 may vary according to the forming condition and a composition ratio.

The semiconductor film 100 may include an amorphous phase. The semiconductor film 100 may partially or entirely have an amorphous phase. Also, the semiconductor film 100 may include a nanocrystalline phase. The semiconductor film 100 may have both an amorphous phase and a nanocrystalline phase. For example, the semiconductor film 100 may have a plurality of nanocrystals (nanocrystalline phase) in an amorphous matrix. The amorphous matrix may include zinc fluoro-oxynitride. The nanocrystals (nanocrystalline phase)

may include, for example, zinc nitride. A size (diameter) of the nanocrystals (nanocrystalline phase) may range, for example, from about several nm to tens of nm.

The semiconductor film 100 may include zinc fluoro-oxynitride, and may further include at least one of zinc nitride, zinc oxide, and zinc fluoride. The zinc fluoro-oxynitride may be amorphous, and the zinc nitride, the zinc oxide, and the zinc fluoride may be crystalline. Also, the semiconductor film 100 may further include at least one of zinc oxynitride, zinc fluoronitride, and zinc fluorooxide. The zinc oxynitride, the zinc fluoronitride, and the zinc fluorooxide may be amorphous.

Additionally, the semiconductor film 100 may further include one or more other elements in addition to zinc, fluorine, oxygen, and nitrogen. For example, the semiconductor film 100 may further include at least one of a group I element, a group II element, a group III element, a group IV element, a group V element, a transition metal element, and a lanthanum (Ln)-based element. For example, the semiconductor film 100 may further include at least one of a group I element such as lithium (Li) or potassium (K), a group II element such as magnesium (Mg), calcium (Ca), strontium (Sr), or barium (Ba), a group III element such as gallium (Ga), aluminum (Al), indium (In), or boron (B), a group IV element such as silicon (Si), tin (Sn), or germanium (Ge), a group V element such as antimony (Sb), a transition metal element such as yttrium (Y), titanium (Ti), zirconium (Zr), vanadium (V), niobium (Nb), tantalum (Ta), scandium (Sc), hafnium (Hf), molybdenum (Mo), manganese (Mn), iron (Fe), cobalt (Co), nickel (Ni), copper (Cu), or tungsten (W), and a lanthanum-based element such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu). Such an additional element may be doped in the semiconductor film 100. Alternatively, the additional element may constitute a compound along with basic elements of the semiconductor film 100.

Although not shown in FIG. 1, a surface oxide film or an oxygen-rich material film may be disposed on a surface of the semiconductor film 100. The surface oxide film or the oxygen-rich material film may act as a protection film for the semiconductor film 100. The surface oxide film or the oxygen-rich material film may be formed by using an annealing process. The annealing process may be a stabilization process.

The term "compound semiconductor" used herein refers to a compound having semiconductor characteristics formed by combining two or more types of elements at a predetermined composition ratio, unlike a silicon or germanium semiconductor composed of a single element. A compound semiconductor may have properties different from those of each of constituent elements thereof. In the above description, zinc fluorooxynitride, zinc nitride, zinc oxide, zinc fluoride, zinc oxynitride, zinc fluoronitride, and zinc fluorooxide may each be a compound formed by combining a zinc component and a component such as oxygen, nitrogen, or fluorine at a predetermined composition ratio or a material including such a compound. Each compound may have relatively uniform characteristics, and may have properties different from those of each of constituent elements thereof. The above materials may be compound semiconductor materials or semiconductor materials including compounds. Also, the semiconductor film 100 of FIG. 1 may be a "compound semiconductor" or a "semiconductor including a compound". The term "compound semiconductor" or "semiconductor including a compound" used herein is to be interpreted broadly.

Figure 2:
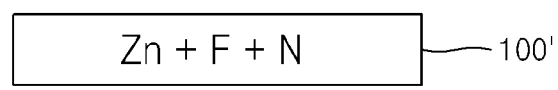
FIG. 2 is a cross-sectional view illustrating a semiconductor film according to another example embodiment.

FIG. 2 is a cross-sectional view illustrating a semiconductor film 100' according to another example embodiment. The semiconductor film 100' may be a thin film. The semiconductor film 100' may be a compound or may include a compound. In this regard, the semiconductor film 100' may be referred to as a "compound semiconductor film" or a "semiconductor film including a compound".

Referring to FIG. 2, the semiconductor film 100' may include zinc, fluorine, and nitrogen. That is, the semiconductor film 100' may include a compound composed of zinc, fluorine, and nitrogen. In this case, the semiconductor film 100' may include zinc fluoronitride ($ZnF_xN_z$ or $ZnN_xF_y$). In other words, the semiconductor film 100' may include fluorine-containing zinc nitride. The fluorine-containing zinc nitride may be the zinc fluoronitride. In other words, the semiconductor film 100' may be a zinc compound semiconductor, and the zinc compound semiconductor may include fluorine and nitrogen. The semiconductor film 100' of FIG. 2 may be different from the semiconductor film 100 of FIG. 1 in that the semiconductor film 100' may not include an oxygen element. However, in some cases, a small amount of oxygen may be included in the semiconductor film 100'. For example, according to an annealing (heat treatment) condition (atmosphere), a small amount of oxygen may be included in the semiconductor film 100'.

In the semiconductor film 100', a content ratio of fluorine to the sum of nitrogen and fluorine, that is, $[F/(N+F)] \times 100$, may be equal to or greater than, for example, about 3 at % or about 5 at %. The content ratio of fluorine may range from about 3 at % to about 45 at % or from about 5 at % to about 45 at %. Alternatively, the content ratio of fluorine may range from about 3 at % to about 40 at % or from about 5 at % to about 40 at %. In the semiconductor film 100', a content ratio of nitrogen to the sum of nitrogen and fluorine, that is, $[N/(N+F)] \times 100$, may be equal to or greater than, for example, about 55 at % or about 65 at %. The content ratio of nitrogen may range from about 55 at % to about 95 at % or from about 65 at % to about 95 at %. A Hall mobility and a carrier density of the semiconductor film 100' may be the same as or similar to or higher than those of the semiconductor film 100 of FIG. 1. A resistivity of the semiconductor film 100' may be the same as or similar to or lower than that of the semiconductor film 100 of FIG. 1.

The semiconductor film 100' may have an amorphous phase and/or a nanocrystalline phase. The semiconductor film 100' may entirely have an amorphous phase, or may have both an amorphous phase and a nanocrystalline phase. In the latter case, the semiconductor film 100' may have a plurality of nanocrystals (nanocrystalline phase) in an amorphous matrix. The nanocrystals (nanocrystalline phase) may be, for example, zinc nitride.

Also, the semiconductor film 100' may include zinc fluoronitride, and may further include at least one of zinc nitride and zinc fluoride. The zinc fluoronitride, the zinc nitride, and the zinc fluoride may each be a "compound" or a "material including a compound". In this regard, the above materials may be compound semiconductor materials or semiconductor materials including compounds, and the semiconductor film 100' of FIG. 2 may be a "compound semiconductor" or a "semiconductor including a compound". Accordingly, the terms "compound semiconductor" and "semiconductor including a compound" used herein are to be interpreted broadly. Additionally, the semiconductor film 100' may further include one or more other elements in addition to zinc, fluorine, and nitrogen. For example, the semiconductor film 100' may further include at least one of a group I element, a group II element, a group III element, a group IV element, a group V element, a transition metal element, and a Lanthanum (Ln)-based element, like the semiconductor film 100 of FIG. 1. Additional example elements for the semiconductor film 100' may be the same as or similar to those for the semiconductor film 100 of FIG. 1. Although not shown in FIG. 2, a surface oxide film or an oxygen-rich material film may be disposed on a surface of the semiconductor film 100'.

A method of forming the semiconductor film 100 of FIG. 1 will now be explained.

Figure 3:
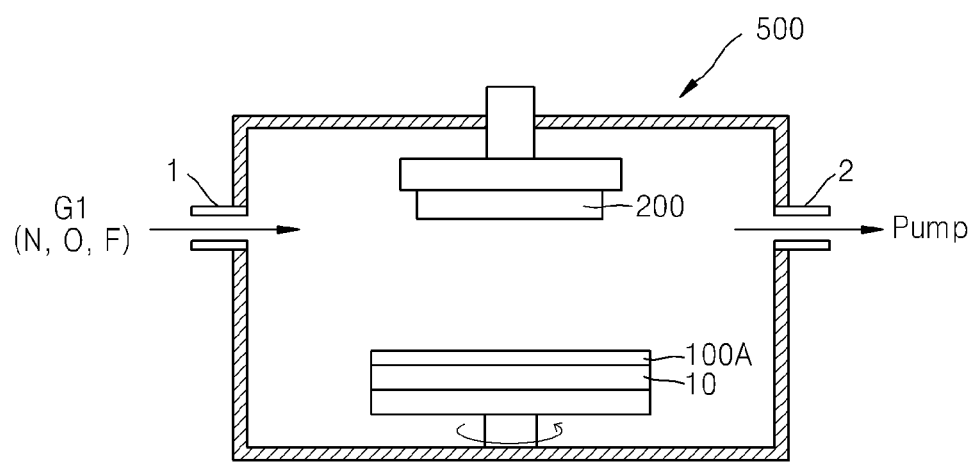
FIG. 3 is a cross-sectional view for explaining a method of forming a semiconductor film, according to an example embodiment.

The semiconductor film 100 of FIG. 1 may be formed by using a sputtering system as shown in FIG. 3. A method of forming a semiconductor film 100A by using sputtering will be explained with reference to FIG. 3.

Referring to FIG. 3, according to at least one example embodiment, the semiconductor film 100A may be formed by using sputtering, which is one of several physical vapor deposition (PVD) methods. The sputtering may be reactive sputtering. The sputtering may use a zinc target 200, and may be performed by using a reactive gas G1 including nitrogen, oxygen, and fluorine. Zinc particles separated from the zinc target 200 may be reacted with nitrogen, oxygen, and fluorine components of the reactive gas G1 to form the semiconductor film 100A including zinc, nitrogen, oxygen, and fluorine. The semiconductor film 100A may be formed on a substrate 10. Reference numeral 500 of FIG. 3 denotes a reaction chamber in which the sputtering is performed, and reference numerals 1 and 2 respectively denote a gas inlet and a gas outlet. A configuration and a structure of the reaction chamber 500 are examples only, and thus may be changed in various ways.

The reactive gas G1 may include a fluorine-containing gas, a nitrogen-containing gas, and an oxygen-containing gas. The fluorine-containing gas may include at least one of $F_2$, $NF_3$, $SF_6$, and $CF_4$, for example. The nitrogen-containing gas may include at least one of $N_2$, $N_2O$, and $NH_3$, for example. The oxygen-containing gas may include at least one of $O_2$, $H_2O$, and $N_2O$, for example. A composition ratio of the semiconductor film 100A may vary according to a flow rate ratio of the fluorine-containing gas, the nitrogen-containing gas, and the oxygen-containing gas. Also, an argon (Ar) gas may be further used in addition to the fluorine-containing gas, the nitrogen-containing gas, and the oxygen-containing gas. The argon gas may act as a carrier gas. Also, the argon gas may improve deposition efficiency by generating plasma. A flow rate of the fluorine-containing gas may range from about 1 sccm to about 10 sccm, a flow rate of the nitrogen-containing gas may range from about 20 sccm to about 200 sccm, and a flow rate of the oxygen-containing gas may range from about 1 sccm to about 15 sccm. When the argon gas is used, a flow rate of the argon gas may range from about 1 sccm to about 100 sccm. The sputtering may be performed at room temperature or at a relatively low temperature that is higher than room temperature (for example, from about 25° C. to about 300° C.). In other words, when the semiconductor film 100A is formed by using sputtering, a temperature of the substrate 10 may be maintained at room temperature or a relatively low temperature that is higher than room temperature (for example, from about 25° C. to about 300° C.). A pressure of the reaction chamber 500 may range from about 0.05 Pa to about 15 Pa. Sputtering power for the zinc target 200 may range from tens to thousands of W (watt). A composition ratio of the semiconductor film 100A may vary as sputtering power for the zinc target 200 varies. The aforesaid detailed process conditions are examples only, and may vary according to a sputtering system.

When the single zinc target 200 is used as in FIG. 3, the semiconductor film 100A having a large size and a uniform characteristic may be easily formed at low cost. If a semiconductor film is formed by using a plurality of different targets (for example, two targets), since it is difficult to uniformly mix particles generated from the two targets, it may be difficult to form a uniform semiconductor film having a large area. However, since one uniform zinc target 200 is used in FIG. 3, a large semiconductor film having uniform film quality may be easily formed. Also, since the zinc target 200 may be easily manufactured at low cost, manufacturing costs of the semiconductor film 100A using the zinc target 200 may be reduced.

The semiconductor film 100A formed by using the method of FIG. 3 may have the same (or similar) composition, composition ratio and properties/characteristics as those of the semiconductor film 100 of FIG. 1. That is, the semiconductor film 100A of FIG. 3 may include a compound composed of zinc, fluorine, oxygen, and nitrogen. The compound composed of zinc, fluorine, oxygen, and nitrogen may be a quaternary compound. The quaternary compound may be zinc fluorooxynitride ($ZnF_xO_yN_z$ or $ZnO_xN_yF_z$). The semiconductor film 100A may include fluorine-containing zinc oxynitride. Also, the semiconductor film 100A may have a Hall mobility equal to or greater than about 10 $cm^2/VS$, or equal to or greater than about 20 $cm^2/Vs$, or equal to or greater than about 30 $cm^2/Vs$. Also, the semiconductor film 100A may further include one or more elements other than zinc, fluorine, oxygen, and nitrogen. The one or more elements may be the same as or similar to those of the semiconductor film 100 of FIG. 1.

Figure 4A:
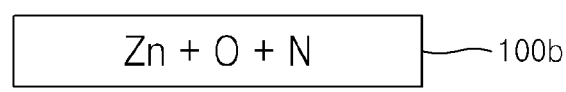
FIGS. 4A through 4C are cross-sectional views for explaining a method of forming a semiconductor film, according to another example embodiment.
Figure 4B:
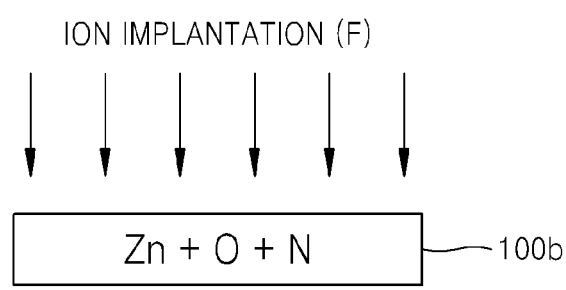
Figure 4C:
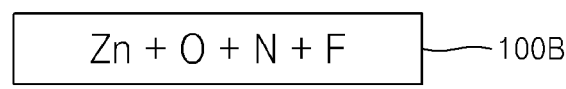

Alternatively, the semiconductor film 100 of FIG. 1 may be formed by using a method of FIGS. 4A through 4C, according to at least one example embodiment. That is, FIGS. 4A through 4C illustrate a method of forming the semiconductor film 100 of FIG. 1, according to another example embodiment. The present example embodiment uses ion implantation.

Referring to FIG. 4A, a first material film 100b including zinc, oxygen, and nitrogen may be formed. The first material film 100b may include zinc oxynitride. For example, the first material film 100b may be a ZnON thin film. The term 'ZnON' used herein does not mean that a composition ratio of zinc, oxygen, and nitrogen is 1:1:1 and just means that it is a compound composed of zinc, oxygen, and nitrogen. The same applies to other similarly described compounds.

Referring to FIG. 4B, fluorine may be ion-implanted into the first material film 100b. A source for the ion implantation, that is, a source of the fluorine, may be, for example, a gas including $F_2$. A dose of the ion implantation may range, for example, from about $1 \times 10^{13}$ to $5 \times 10^{16}$ ions/$cm^2$.

As a result of the ion implantation, a fluorine-containing semiconductor film 100B may be formed as shown in FIG. 4C. The semiconductor film 100B may include fluorine-containing zinc oxynitride. The semiconductor film 100B may include zinc fluoro-oxynitride. At least a portion of the semiconductor film 100B may have the same (or similar) composition, composition ratio and properties/characteristics as those of the semiconductor film 100 of FIG. 1.

Figure 5A:
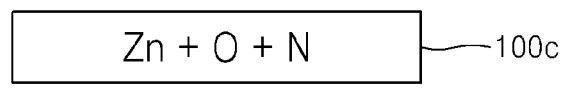
FIGS. 5A through 5C are cross-sectional views for explaining a method of forming a semiconductor film, according to another example embodiment.
Figure 5B:
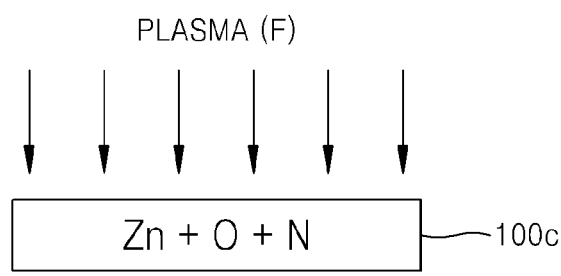
Figure 5C:
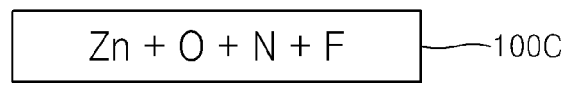

Alternatively, the semiconductor film 100 of FIG. 1 may be formed by using an example method illustrated in FIGS. 5A through 5C. That is, FIGS. 5A through 5C illustrate a method of forming the semiconductor film 100 of FIG. 1, according to another example embodiment. The present embodiment uses plasma treating (processing).

Referring to FIG. 5A, a first material film 100c including zinc, oxygen, and nitrogen may be formed. The first material film 100c may include zinc oxynitride. For example, the first material film 100c may be a ZnON thin film. The first material film 100c may be substantially the same as or similar to the first material film 100b of FIG. 4A.

Referring to FIG. 5B, plasma treating (processing) may be performed on the first material film 100c. The plasma treating may be performed by using a fluorine-containing gas. In other words, the first material film 100c may be treated by using plasma of the fluorine-containing gas. The fluorine-containing gas may include at least one of $F_2$, $NF_3$, $SF_6$, and $CF_4$, for example. During the plasma treatment, fluorine may be injected into the first material film 100c. Source power for the plasma treatment may range from, for example, about tens of Watts to hundreds of Watts (W). Also, the plasma treatment may be performed at a temperature ranging from, for example, about 100° C. to about 450° C. for tens of seconds to tens of minutes. The plasma treatment may be performed in a chemical vapor deposition (CVD) chamber.

As a result of the plasma treatment, a fluorine-containing semiconductor film 100C may be formed as shown in FIG. 5C. The semiconductor film 100C may include fluorine-containing zinc oxynitride. The semiconductor film 100C may include zinc fluoro-oxynitride. At least a portion of the semiconductor film 100C may have the same (or similar) composition, composition ratio and properties/characteristics as those of the semiconductor film 100 of FIG. 1. The plasma treatment of FIG. 5B may be performed on only a portion of a top surface of the first material film 100c. In this case, the portion of the top surface on which the plasma treatment has been performed may have the same (or similar) composition, composition ratio and properties/characteristics as those of the semiconductor film 100 of FIG. 1. When the first material film 100c has a small thickness, uniform plasma processing may be performed over the entire first material film 100c.

Figure 6:
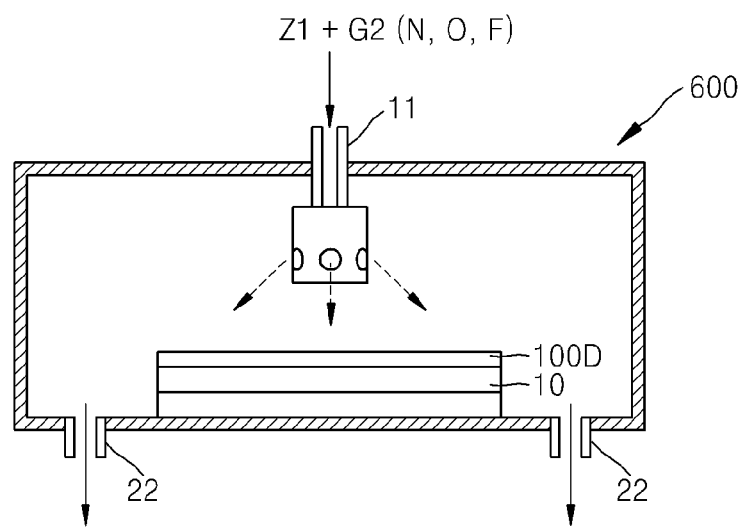
FIG. 6 is a cross-sectional view for explaining a method of forming a semiconductor film, according to another example embodiment.

Alternatively, the semiconductor film 100 of FIG. 1 may be formed by using a CVD apparatus as shown in FIG. 6. A method of forming a semiconductor film 100D by using CVD will be explained with reference to FIG. 6.

Referring to FIG. 6, the semiconductor film 100D may be formed by using CVD, according to at least one example embodiment. The CVD may be, for example, metal organic chemical vapor deposition (MOCVD). The CVD may use a precursor Z1 of zinc, and may be performed by using a reactive gas G2 including nitrogen, oxygen, and fluorine. The precursor Z1 may include at least one of dimethylzinc and diethylzinc, for example. The precursor Z1 may be dimethylzinc or may include dimethylzinc. Alternatively, the precursor Z1 may be diethylzinc or may include diethylzinc. If necessary, the precursor Z1 may include both dimethylzinc and diethylzinc. The precursor Z1 may be injected as a gas. The precursor Z1 and the reactive gas G2 may be injected into a reaction chamber 600 through a gas inlet 11. The precursor Z1 and the reactive gas G2 may be collectively referred to as a "reactive gas." The semiconductor film 100D may be formed on the substrate 10 due to a reaction between the precursor Z1 and the reactive gas G2. Byproducts of the reaction may be discharged to the outside of the reaction chamber 600 through gas outlets 22. A configuration and a structure of the reaction chamber 600 of FIG. 5 are examples, and may be changed in various ways.

The reactive gas G2 may include a fluorine-containing gas, a nitrogen-containing gas, and an oxygen-containing gas. The fluorine-containing gas may include at least one of $F_2$, $NF_3$, $SF_6$, and $CF_4$, for example. The nitrogen-containing gas may include at least one of $N_2$, $N_2O$, and $NH_3$, for example. The oxygen-containing gas may include at least one of $O_2$, $H_2O$, and $N_2O$, for example. A composition ratio of the semiconductor film 100D may vary according to a flow rate ratio of the fluorine-containing gas, the nitrogen-containing gas, and the oxygen-containing gas, and a supply amount of the precursor Z1. The CVD may be performed at a temperature ranging from, for example, about 150° C. to about 450° C. In other words, when the semiconductor film 100D is formed by using the CVD, a temperature of the substrate 10 may be maintained at about 150° C. to 450° C. A pressure of the reaction chamber 600 may range from about 1 mTorr to about 5 Torr. However, the aforesaid detailed process conditions are examples only, and may be changed according to the CVD apparatus.

The semiconductor film 100D formed by using the method of FIG. 6 may have the same (or similar) composition, composition ratio and properties/characteristics as those of the semiconductor film 100 of FIG. 1. That is, the semiconductor film 100D of FIG. 6 may include a compound composed of zinc, fluorine, oxygen, and nitrogen. The compound composed of zinc, fluorine, oxygen, and nitrogen may be a quaternary compound. The quaternary compound may be zinc fluoro-oxynitride (ZnFxOyNz or ZnOxNyFz). The semiconductor film 100D may include fluorine-containing zinc oxynitride. Also, the semiconductor film 100A may have a Hall mobility equal to or greater than about 10 cm$^2$/Vs, or equal to or greater than about 20 cm$^2$/Vs, or equal to or greater than about 30 cm$^2$/Vs. Also, the semiconductor film 100D may further include one or more elements other than zinc, fluorine, oxygen, and nitrogen. The one or more elements may be the same as or similar to those of the semiconductor film 100 of FIG. 1.

Alternatively, the semiconductor film 100 of FIG. 1 may be formed by using a solution process. The solution process may be performed by using a solution obtained by mixing a precursor including zinc and a precursor including fluorine with a solvent such as monoethanolamine (MEA) or N-methyl-2-pyrrolidone (NMP), for example. The precursor including zinc may be expressed as Zn—R or Zn—OR', where R may be chlorine (Cl), iodine (I), bromine (Br), fluorine (F), NO$_3$, or acetate, and R' may be the same as or similar material to R. The precursor including fluorine may be, for example, NH$_4$F. A semiconductor film including zinc, nitrogen, fluorine, and oxygen may be formed by forming a thin film from the solution by using a sol-gel method and performing heat treatment/oxidation and/or nitridation on the thin film. The semiconductor film may be the same as or similar to the semiconductor film 100 of FIG. 1. The solution process is an example, and may be changed in various ways.

The semiconductor film 100' of FIG. 2 may be formed by modifying the methods of forming the semiconductor film 100 of FIG. 1 described with reference to FIGS. 3 through 6. That is, the semiconductor film 100' of FIG. 2 may be formed by not using an oxygen-containing gas (that is, having a flow rate of an oxygen-containing gas be 0 sccm) or excluding oxygen from the first material films 100b and 100c in the various methods of FIGS. 3 through 6, which will be explained in more detail.

Figure 7:
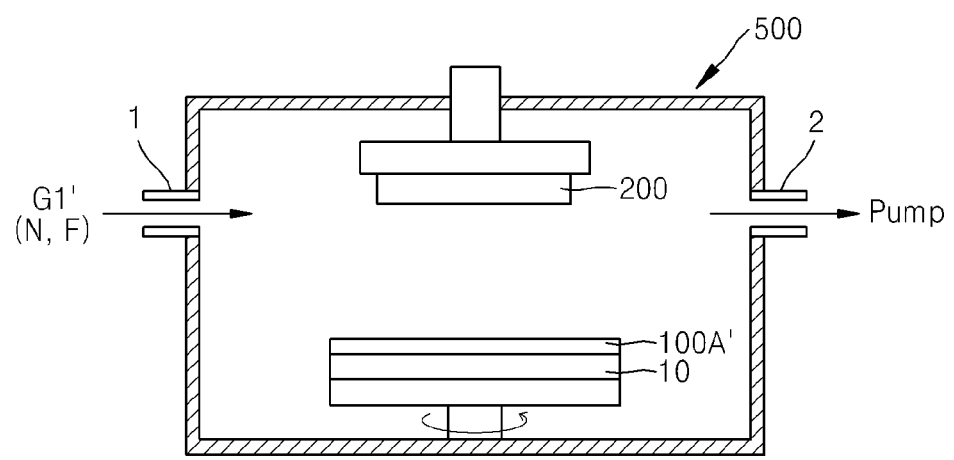
FIG. 7 is a cross-sectional view for explaining a method of forming a semiconductor film, according to another example embodiment.

A semiconductor film including zinc, fluorine, and nitrogen may be obtained by excluding an oxygen-containing gas of the reactive gas G1 in the method of forming the semiconductor film 100A described with reference to FIG. 3, as shown in FIG. 7, according to at least one example embodiment. In FIG. 7, G1' denotes a reactive gas from which an oxygen-containing gas is excluded, and 100A' denotes a semiconductor film. The semiconductor film 100A' may be the same as or similar to the semiconductor film 100' of FIG. 2.

Figure 8A:
FIGS. 8A through 8C are cross-sectional views for explaining a method of forming a semiconductor film, according to another example embodiment.
Figure 8B:
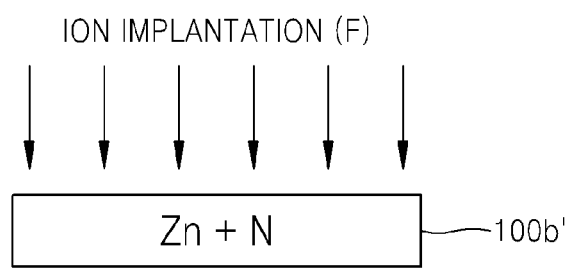
Figure 8C:
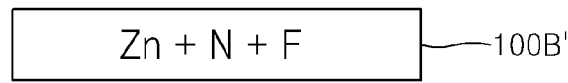
Figure 9A:
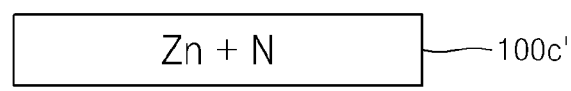
FIGS. 9A through 9C are cross-sectional views for explaining a method of forming a semiconductor film, according to another example embodiment.
Figure 9B:
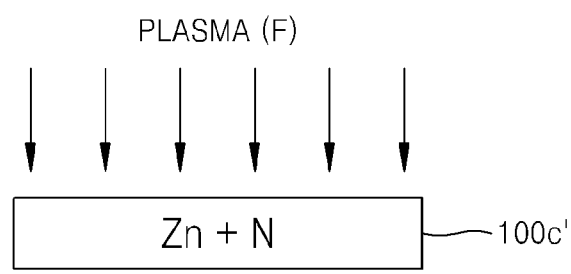
Figure 9C:
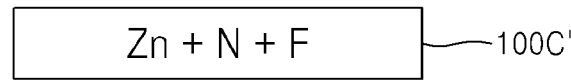

When oxygen is excluded from the first material films 100b and 100c in the methods of forming the semiconductor films 100B and 100C described with reference to FIGS. 4A through 4C and FIGS. 5A through 5C, the semiconductor film 100' of FIG. 2 may be formed, as shown in FIGS. 8A through 8C, according to an example embodiment, and FIGS. 9A through 9C, according to another example embodiment. In FIGS. 8A through 8C and FIGS. 9A through 9C, first material films 100b' and 100c' may be material films including zinc and nitrogen, and semiconductor films 100B' and 100C' may be material films including zinc, nitrogen, and fluorine. At least a portion of each of the semiconductor films 100B' and 100C' may be the same as or similar to the semiconductor film 100' of FIG. 2.

Figure 10:
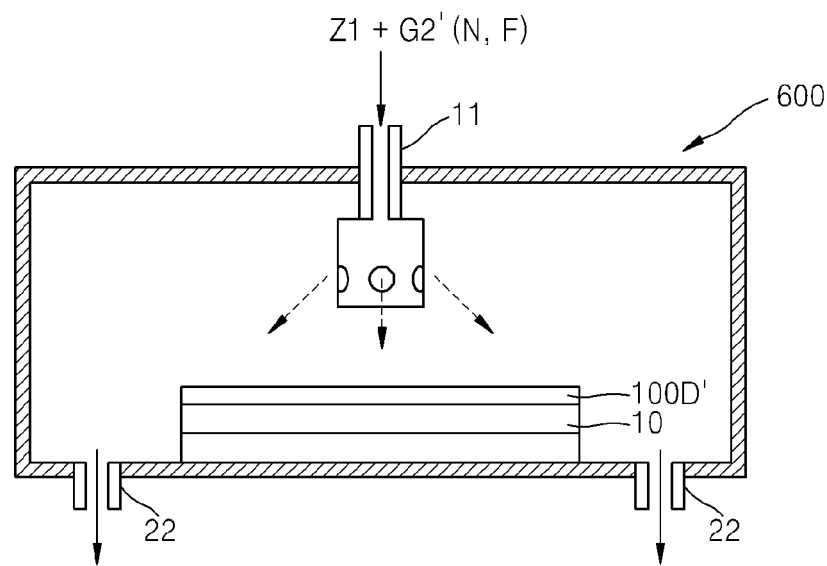
FIG. 10 is a cross-sectional view for explaining a method of forming a semiconductor film, according to another example embodiment.

A semiconductor film including zinc, fluorine, and nitrogen may be obtained by excluding an oxygen-containing gas from the reactive gas G2 in the method of forming the semiconductor film 100D described with reference to FIG. 6, as shown in FIG. 10, according to at least one example embodiment. In FIG. 10, G2' denotes a reactive gas from which an oxygen-containing gas is excluded, and 100D' denotes a semiconductor film. The semiconductor film 100D' may be the same as or similar to the semiconductor film 100' of FIG. 2.

Also, the semiconductor film 100' of FIG. 2 may be formed by using a solution process. That is, the semiconductor film 100' of FIG. 2 may be obtained by not providing oxygen into a semiconductor film in the solution process described above.

Figure 11:
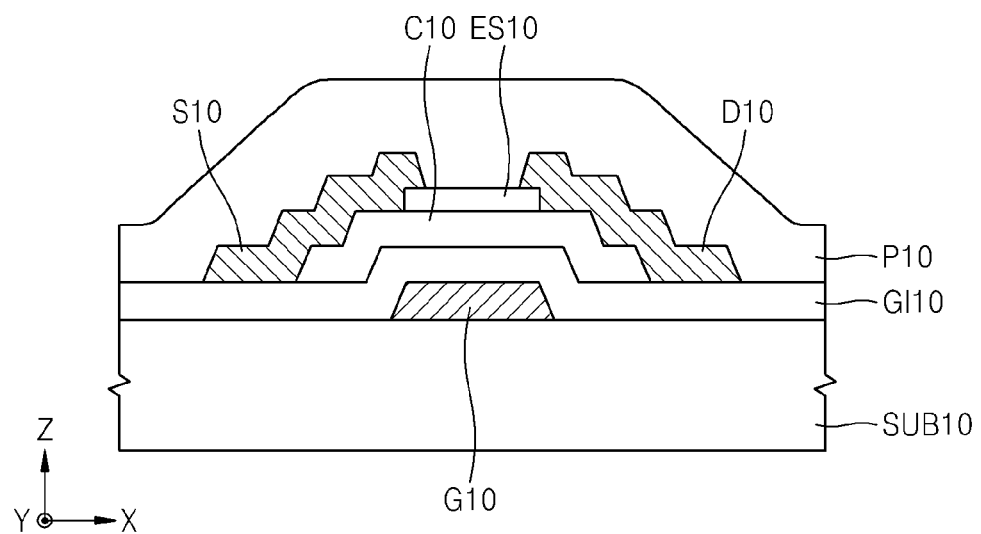
FIG. 11 is a cross-sectional view illustrating a transistor including a semiconductor film, according to an example embodiment.

FIG. 11 is a cross-sectional view illustrating a transistor including a semiconductor film, according to an example embodiment. The transistor of FIG. 11 is a thin film transistor (TFT) having a bottom gate structure in which a gate electrode G10 is disposed below (under) a channel layer C10.

Referring to FIG. 11, the gate electrode G10 may be disposed on a substrate SUB10. The substrate SUB10 may be a glass substrate, or any one of various substrates used in a common semiconductor device process such as a plastic substrate or a silicon substrate. The gate electrode G10 may be formed of a general electrode material (e.g., a metal, an alloy, conductive metal oxide, conductive metal nitride, or the like). The gate electrode G10 may have a single-layer structure or a multi-layer structure. A gate insulating layer GI10 that covers the gate electrode G10 may be disposed on the substrate SUB10. The gate insulating layer GI10 may include a silicon oxide layer, a silicon oxynitride layer, or a silicon nitride layer, or may include another material layer, for example, a high-k material layer having a dielectric constant higher than that of a silicon nitride layer. The gate insulating layer GI10 may have a structure in which at least two layers from among a silicon oxide layer, a silicon oxynitride layer, a silicon nitride layer, and a high-k material layer are stacked. In detail, the gate insulating layer GI10 may have a structure in which a silicon nitride layer and a silicon oxide layer are stacked, for example. In this case, the silicon nitride layer and the silicon oxide layer may be disposed on the gate electrode G10, and may be alternatively sequentially deposed on the gate electrode G10.

The channel layer C10 may be disposed on the gate insulating layer GI10. The channel layer C10 may be disposed over the gate electrode G10 to face the gate electrode G10. A width of the channel layer C10 in an X-axis direction may be greater than a width of the gate electrode G10 in the X-axis direction. However, in some cases, a width of the channel layer C10 may be the same as or similar to or less than a width of the gate electrode G10. A material of the channel layer C10 may be the same as that of the semiconductor film 100 of FIG. 1 or may be the same as that of the semiconductor film 100' of FIG. 2. That is, the channel layer C10 may be formed of a semiconductor including zinc, fluorine, oxygen, and nitrogen, or a semiconductor including zinc, fluorine, and nitrogen. In other words, the channel layer C10 may include zinc fluorooxynitride or zinc fluoronitride. A material, properties, characteristics, and modifications of the channel layer C10 may be the same as or similar to those of the semiconductor films 100 and 100' of FIGS. 1 and 2. The channel layer C10 may be formed by using any of the methods described with reference to FIGS. 3 through 10. A thickness of the channel layer C10 may range from about 10 nm to about 150 nm, for example, from about 20 nm to about 100 nm. However, a thickness range of the channel layer C10 may be changed.

An etch-stop layer ES10 may be disposed on the channel layer C10. A width of the etch-stop layer ES10 in the X-axis direction may be less than a width of the channel layer C10. Both ends of the channel layer C10 may not be covered by the etch-stop layer ES10. The etch-stop layer ES10 may include, for example, silicon oxide, silicon oxynitride, silicon nitride, or an organic insulating material.

A source electrode S10 and a drain electrode D10 that respectively contact first and second regions (for example, both ends) of the channel layer C10 may be disposed on the gate insulating layer GI10. The source electrode S10 and the drain electrode D10 may each have a single-layer structure or a multi-layer structure. A material of each of the source electrode S10 and the drain electrode D10 may be the same as or similar to that of the gate electrode G10. Each of the source electrode S10 and the drain electrode D10 may be formed of the same material as the gate electrode G10, or a different material than the gate electrode G10. The source electrode S10 may have a structure that contacts the first region (for example, one end) of the channel layer C10 and extends over one end of the etch-stop layer ES10, and the drain electrode D10 may have a structure that contacts the second region (for example, the other end) of the channel layer C10 and extends over the other end of the etch-stop layer ES10. The etch-stop layer ES10 may prevent the channel layer C10 from being damaged during an etching process for forming the source electrode S10 and the drain electrode D10.

A passivation layer P10 that covers the etch-stop layer ES10, the source electrode S10, and the drain electrode D10 may be disposed on the gate insulating layer GI10. The passivation layer P10 may be a silicon oxide layer, a silicon oxynitride layer, a silicon nitride layer, or an organic layer, or may have a structure in which at least two of the silicon oxide layer, the silicon oxynitride layer, the silicon nitride layer, and the organic layer are stacked. For example, the passivation layer P10 may have a single-layer structure formed of silicon oxide or silicon nitride, or a multi-layer structure including a silicon oxide layer and a silicon nitride layer that is disposed on the silicon oxide layer. Also, the passivation layer P10 may have a multi-layer structure including three or more layers. In this case, the passivation layer P10 may include a silicon oxide layer, a silicon oxynitride layer, and a silicon nitride layer that are sequentially stacked. Thicknesses of the gate electrode G10, the gate insulating layer GI10, the source electrode S10, the drain electrode D10, and the passivation layer P10 may respectively range from about 50 to about 300 nm, from about 50 to about 400 nm, from about 10 to about 200 nm, from about 10 to about 200 nm, and from about 50 to about 1200 nm. However, thickness ranges may be changed in some cases.

Whether to use the etch-stop layer ES10 may be determined according to a material of the channel layer C10 and materials of the source electrode S10 and the drain electrode D10. Alternatively, whether to use the etch-stop layer ES10 may be determined according to an etching process for forming the source electrode S10 and the drain electrode D10.

Figure 12:
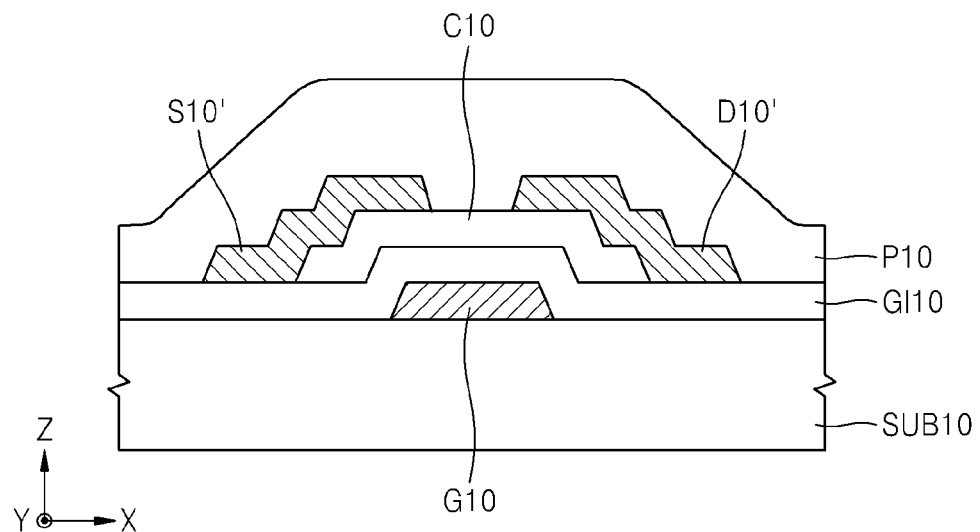
FIG. 12 is a cross-sectional view illustrating a transistor including a semiconductor film, according to another example embodiment.

Accordingly, in some cases, the etch-stop layer ES10 may be omitted from the transistor of FIG. 11, as shown in FIG. 12.

Referring to FIG. 12, a source electrode S10' may contact the first region (for example, one end) of the channel layer C10, and a drain electrode D10' may contact the second region (for example, the other end) of the channel layer C10, according to at least one example embodiment. The source electrode S10' may extend to a portion of the gate insulating layer GI10 adjacent to the first region, and likewise, the drain electrode D10' may extend to a portion of the gate insulting layer GI10 adjacent to the second region. Except that the etch-stop layer ES10 (see FIG. 11) is not used and shapes of the source electrode S10' and the second drain electrode D10' are slightly different, a transistor of FIG. 12 may be the same as or similar to or the same as the transistor of FIG. 11. In the transistor of FIG. 12, a back-channel region may be exposed during an etching process. In this regard, the transistor of FIG. 12 may be referred to as a back-channel etch structure or an etch-back structure.

A field-effect mobility of each of the transistors of FIGS. 11 and 12 may be equal to or greater than, for example, about 10 $cm^2$/Vs, or about 20 $cm^2$/Vs, or about 30 $cm^2$/Vs. The field-effect mobility may be increased to, for example, about 110 cm2/Vs or more. A sub-threshold swing (S.S.) value of the transistor may be equal to or lower than, for example, about 0.95 V/dec or about 0.75 V/dec. The subthreshold swing (S.S.) value may be reduced to about 0.4 V/dec or less. As to the field-effect mobility and the sub-threshold swing (S.S.) value (range), the transistor according to example embodiments may have excellent switching characteristics and a high mobility. This is the same for transistors of other embodiments that will be explained below.

Figure 13:
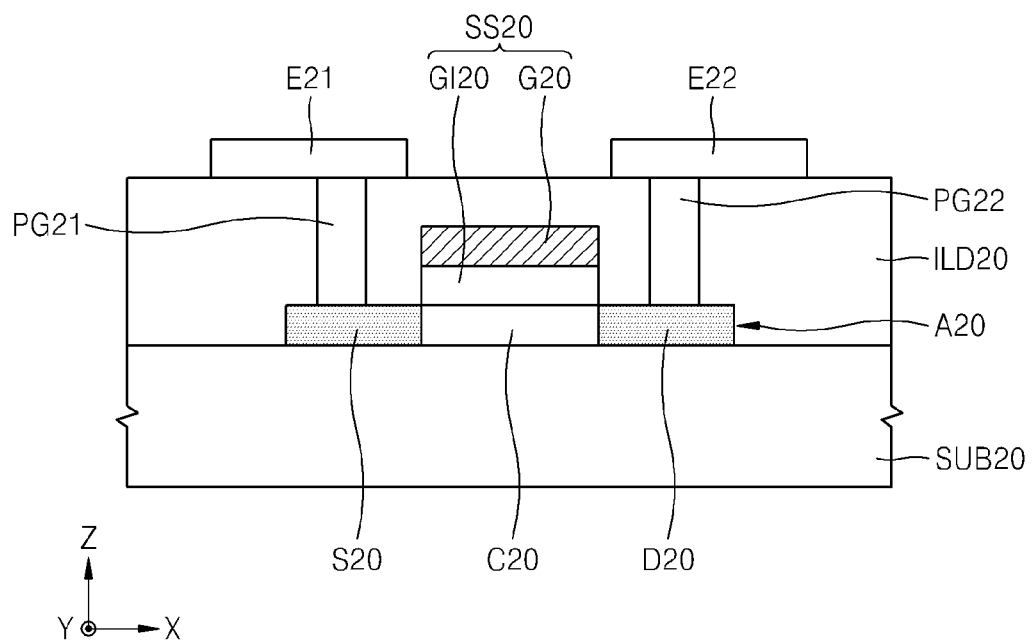
FIG. 13 is a cross-sectional view illustrating a transistor including a semiconductor film, according to another example embodiment.

FIG. 13 is a cross-sectional view illustrating a transistor according to another example embodiment. The transistor of FIG. 13 is a TFT having a top gate structure in which a gate electrode G20 is disposed above (over) a channel region C20.

Referring to FIG. 13, an active layer A20 may be disposed on a substrate SUB20. The substrate SUB20 may be a glass substrate, or any one of various substrates used in a common semiconductor device process such as a plastic substrate or a silicon substrate. The active layer A20 may be a layer formed of a semiconductor. The active layer A20 may be a layer formed of any of the semiconductor films 100 and 100' of FIGS. 1 and 2. Accordingly, the active layer A20 may be formed of a semiconductor including zinc, fluorine, oxygen, and nitrogen, or a semiconductor including zinc, fluorine, and nitrogen. In other words, the active layer A20 may be formed of a semiconductor including zinc fluorooxynitride or a semiconductor including zinc fluoronitride. The active layer A20 may have the channel region C20 at or around a central portion thereof. A material, properties, characteristics, and modifications of the channel region C20 may be the same as or similar to those of the semiconductor films 100 and 100' of FIGS. 1 and 2.

A stacked structure SS20 in which a gate insulating layer GI20 and the gate electrode G20 are sequentially stacked may be disposed on the channel region C20 of the active layer A20. A source region S20 and a drain region D20 may be disposed in the active layer A20 on both sides of the stacked structure SS20. The source region S20 and the drain region D20 may each have an electrical conductivity higher than that of the channel region C20. The source region S20 and the drain region D20 may be conductive regions. The source region S20 and the drain region D20 may be regions that are treated (processed) with plasma. For example, the source region S20 and the drain region D20 may be regions treated (processed) with plasma including hydrogen (H). When the active layer A20 on both sides of the stacked structure SS20 is treated (processed) by using plasma of a gas including hydrogen (H), the source region S20 and the drain region D20 having conductive property may be formed. In this case, the gas including the hydrogen (H) may be $NH_3$, $H_2$, $SiH_4$, or the like. When both end portions of the active layer A20 are treated (processed) by using the plasma of the gas including the hydrogen (H), the hydrogen may act as a carrier by entering the active layer A20. Also, the plasma of the hydrogen may remove an anion (oxygen or the like) of the active layer A20, and thus, an electrical conductivity of a plasma-treated region may be increased. Thus, the source region S20 and the drain region D20 may each include a region which anion (oxygen or the like) concentration is relatively low. In other words, the source region S20 and the drain region D20 may each include a region which cation concentration is relatively high, for example, a zinc-rich region.

An interlayer insulating layer ILD20 that covers the gate electrode G20, and the source region S20 and the drain region D20 may be disposed on the substrate SUB20. First and second electrodes E21 and E22 that are electrically connected to the source region S20 and the drain region D20 may be disposed on the interlayer insulating layer ILD20. The source region S20 and the first electrode E21 may be connected to each other through a conductive plug PG21, and the drain region D20 and the second electrode E22 may be connected to each other through a second conductive plug PG22. The first and second electrodes E21 and E22 may be respectively referred to as a source electrode and a drain electrode. Alternatively, the source region S20 and the drain region D20 may be referred to as a source electrode and a drain electrode. A passivation layer (not shown) that covers the first and second electrodes E21 and E22 may be further disposed on the interlayer insulating layer ILD20.

The transistor of FIG. 13 may have a self-aligned top gate structure in which positions of the source/drain regions S20 and D20 on both sides of the gate electrode G20 are automatically determined by a position of the gate electrode G20. In this case, the source region S20 and the drain region D20 may not overlap with the gate electrode G20. The self-aligned top gate structure may be advantageous in scaling down a device (transistor) and increasing an operating speed. In particular, since a parasitic capacitance may be reduced, RC (resistance-capacitance) delay may be suppressed and thus, an operating speed may be increased.

Figure 14:
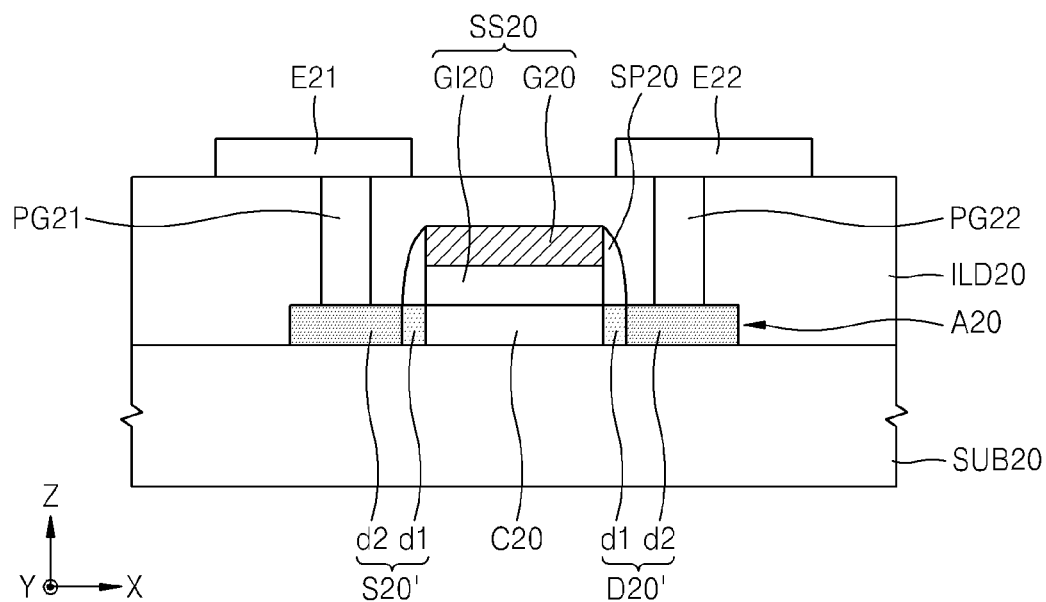
FIG. 14 is a cross-sectional view illustrating a transistor including a semiconductor film, according to another example embodiment.

FIG. 14 is a cross-sectional view illustrating a transistor according to another example embodiment. FIG. 14 is a modification of FIG. 13 and is different from FIG. 13 in that an insulating spacer SP20 is disposed on both side walls of the stacked structure SS20, and modified source/drain regions S20' and D20' are provided.

Referring to FIG. 14, the insulating spacers SP20 may be disposed on both side walls of the stacked structure SS20. The source region S20' and the drain region D20' may be provided in the active layer A20 on both sides of the stacked structure SS20. Each of the source region S20' and the drain region D20' may include two regions (hereinafter, referred to as first and second conductive regions) d1 and d2 having different electrical conductivities. The first conductive region d1 may be disposed adjacent to the channel region C20, that is, under each of the insulating spacers SP20. An electrical conductivity of the first conductive region d1 may be lower than an electrical conductivity of the second conductive region d2. The first conductive region dl may be a region that is the same as or similar to a lightly doped drain (LDD) region. The source region S20' and the drain region D20' may be regions that are treated with plasma. A plasma treating time or number of the first conductive region d1 may be less than a plasma treating time or number of the second conductive region d2. In FIG. 14, the insulating spacer SP20 may be provided in order to form the first and second conductive regions d1 and d2 being different from each other. In more detail, the first and second conductive regions d1 and d2 may be formed by forming the stacked structure SS20, performing a first plasma treatment on the active layer A20 at both sides of the stacked structure SS20, forming the insulating spacer SP20 on both side walls of the stacked structure SS20, and performing a second plasma treatment on the active layer A20 at both sides of the stacked structure SS20 and the insulating spacer SP20. In other words, the insulating spacer SP20 may be used to form an LDD structure in the active layer A20. Also, the insulating spacer SP20 may protect side walls of the gate electrode G20.

Figure 15:
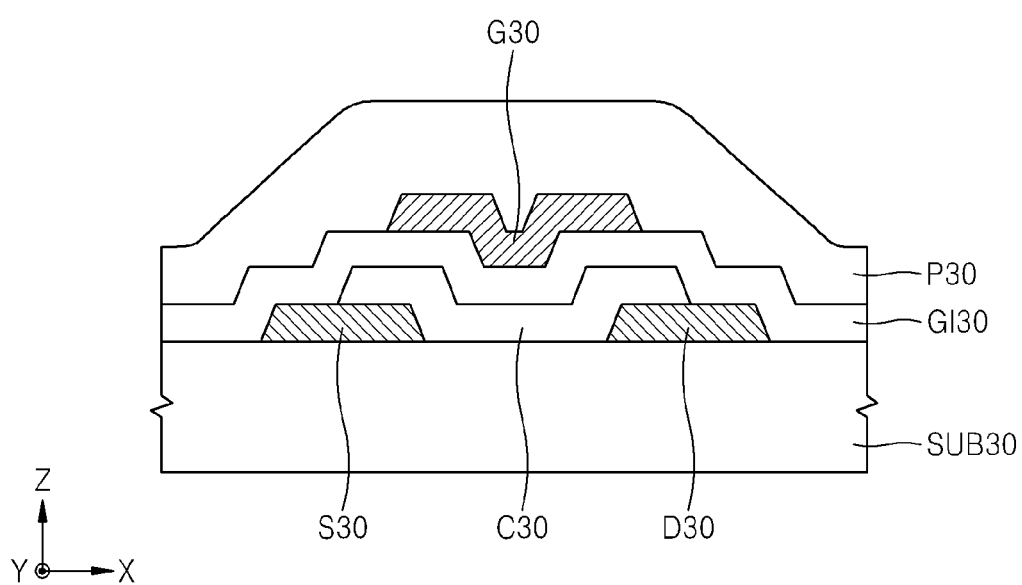
FIG. 15 is a cross-sectional view illustrating a transistor including a semiconductor film, according to another example embodiment.

FIG. 15 is a cross-sectional view illustrating a transistor according to another example embodiment. The transistor of FIG. 15 has another top gate structure.

Referring to FIG. 15, a source electrode S30 and a drain electrode D30 that are spaced apart from each other may be disposed on a substrate SUB30. A channel layer C30 that contacts the source electrode S30 and the drain electrode D30 may be disposed on the SUB30 between the source electrode S30 and the drain electrode D30. A material of the channel layer C30 may be the same as the semiconductor material C30 of FIG. 1 or the semiconductor film 100' of FIG. 2. That is, the channel layer C30 may be formed of a semiconductor including zinc, fluorine, oxygen, and nitrogen, or a semiconductor including zinc, fluorine, and nitrogen. In other words, the channel layer C30 may include zinc fluoro-oxynitride, or zinc fluoronitride. A material, properties, characteristics, and modifications of the channel layer C30 may be the same as or similar to those of the semiconductor films 100 and 100' of FIGS. 1 and 2. The channel layer C30 may be formed by using any of the methods described with reference to FIGS. 3 through 10. A thickness of the channel layer C30 may range from about 10 nm to about 150 nm, for example, from about 20 nm to about 100 nm. However, a thickness range of the channel layer C30 may be changed.

A gate insulating layer GI30 that covers the channel layer C30, and the source electrode S30 and the drain electrode D30 may be disposed on the substrate SUB30. A gate electrode G30 may be disposed on the gate insulating layer GI30. The gate electrode G30 may be disposed over the channel layer C30. A passivation layer P30 that covers the gate electrode G30 may be disposed on the gate insulating layer GI30.

Materials and thicknesses of the substrate SUB30, the source electrode S30, the drain electrode D30, the channel layer C30, the gate insulating layer GI30, the gate electrode G30, and the passivation layer P30 of FIG. 15 may be respectively the same as or similar to those of the substrate SUB10, the source electrode S10, the drain electrode D10, the channel layer C10, the gate insulating layer GI10, the gate electrode G10, and the passivation layer P10 of FIG. 11. A positional relationship between the channel layer C30, and the source electrode S30 and the drain electrode D30 in FIG. 15 may be modified to be the same as or similar to that of FIG. 12. In other words, although the source electrode S30 and the drain electrode D30 are disposed to contact bottom surfaces of both ends of the channel layer C30 in FIG. 15, the channel layer C30 may be first formed and then the source electrode S30 and the drain electrode D30 that contact top surfaces of both ends of the channel layer C30 may be formed. In addition, the structure of FIG. 15 may be changed in various ways.

A method of manufacturing a transistor including a semiconductor film according to an example embodiment will now be exemplarily explained.

FIGS. 16A through 16G are cross-sectional views for explaining a method of manufacturing a transistor, according to an example embodiment. The method of FIGS. 16A through 16G is an example method of manufacturing a TFT having a bottom gate structure.

Figure 16A:
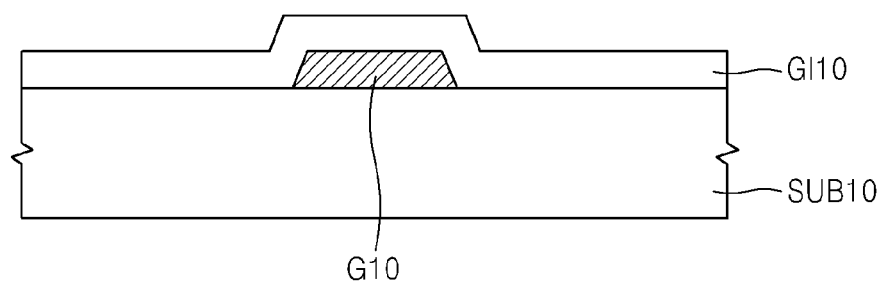
FIGS. 16A through 16G are cross-sectional views for explaining a method of manufacturing a transistor, according to an example embodiment.

Referring to FIG. 16A, a gate electrode G10 may be formed on a substrate SUB10, and a gate insulating layer GI10 that covers the gate electrode G10 may be formed, according to at least one example embodiment. The substrate SUB10 may be a glass substrate, or any one of various substrates used in a common semiconductor device process such as a plastic substrate or a silicon substrate. The gate electrode G10 may be formed of a general electrode material (e.g., a metal, an alloy, conductive metal oxide, conductive metal nitride, or the like). The gate electrode G10 may have a single-layer structure or a multi-layer structure. The gate insulating layer GI10 may be formed of silicon oxide, silicon oxynitride, or silicon nitride, or may be formed of another material, for example, a high-k material having a dielectric constant higher than that of silicon nitride. The gate insulating layer GI10 may be formed to have a structure in which at least two layers from among a silicon oxide layer, a silicon oxynitride layer, a silicon nitride layer, and a high-k material layer are stacked. In detail, the gate insulating layer GI10 may be formed to have a structure in which a silicon nitride layer and a silicon oxide layer are stacked, for example. In this case, the gate insulating layer GI10 may be formed by sequentially stacking the silicon nitride layer and the silicon oxide layer on the gate electrode G10.

Figure 16B:
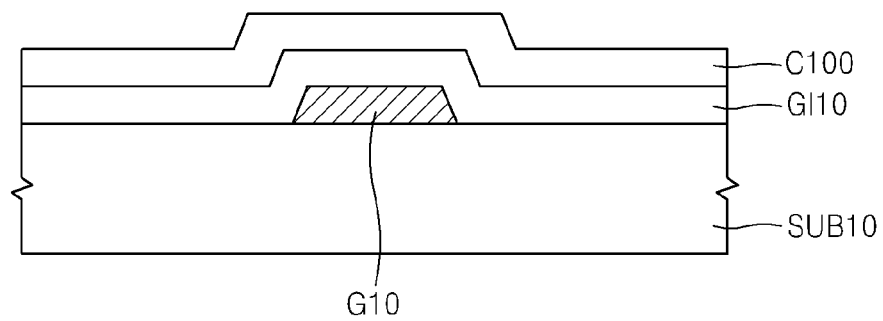
Figure 16C:
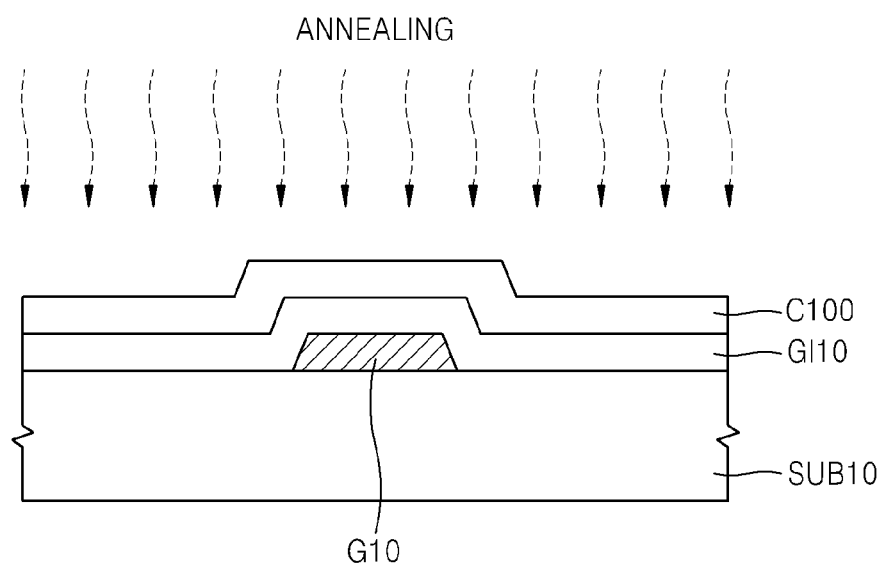

Referring to FIG. 16B, a channel semiconductor layer C100 may be formed on the gate insulating layer GI10, according to at least one example embodiment. The channel semiconductor layer C100 may be formed of a semiconductor including zinc, fluorine, oxygen, and nitrogen, or a semiconductor including zinc, fluorine, and nitrogen. In other words, the channel semiconductor layer C100 may be formed of a semiconductor including zinc fluorooxynitride, or a semiconductor including zinc fluoronitride. The channel semiconductor layer C100 may be formed by using any of the methods described with reference to FIGS. 3 through 10. A thickness of the channel semiconductor layer C100 may range from about 10 nm to about 150 nm, for example, from about 20 nm to about 100 nm. In some cases, an appropriate thickness range may be changed.

Figure 16D:
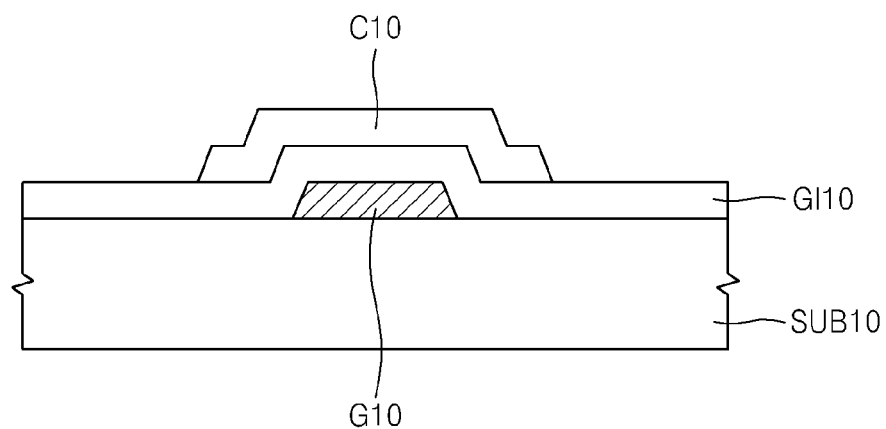

Referring to FIG. 16O, the channel semiconductor layer C100 may be annealed (that is, subjected to heat treatment), according to at least one example embodiment. The annealing may be performed at a temperature equal to or lower than about 450° C., for example, a temperature ranging from about 150° C. to about 450° C. Also, the annealing may be performed in an $N_2$, $O_2$, or air atmosphere. Due to the annealing, the channel semiconductor layer C100 may be stabilized. Also, a protection film (not shown) may be formed on a surface of the channel semiconductor layer C100 due to the annealing. The protection film may be a surface oxide film or an oxygen-rich material film. The protection film may have a density higher than that of the channel semiconductor layer C100 disposed under the protection film. A time when the annealing is performed may be changed. For example, the annealing may be performed after the channel semiconductor layer C100 is patterned as shown in FIG. 16D. However, the annealing is optional, and thus may not be performed in some cases.

Referring to FIG. 16D, a channel layer C10 may be formed by patterning the channel semiconductor layer C100, according to at least one example embodiment. The channel layer C10 may be disposed above the gate electrode G10. That is, the channel layer C10 may be disposed to face the gate electrode G10. A material, properties, characteristics, and modifications of the channel layer C10 may be the same as or similar to those of the semiconductor films 100 and 100' of FIGS. 1 and 2.

Figure 16E:
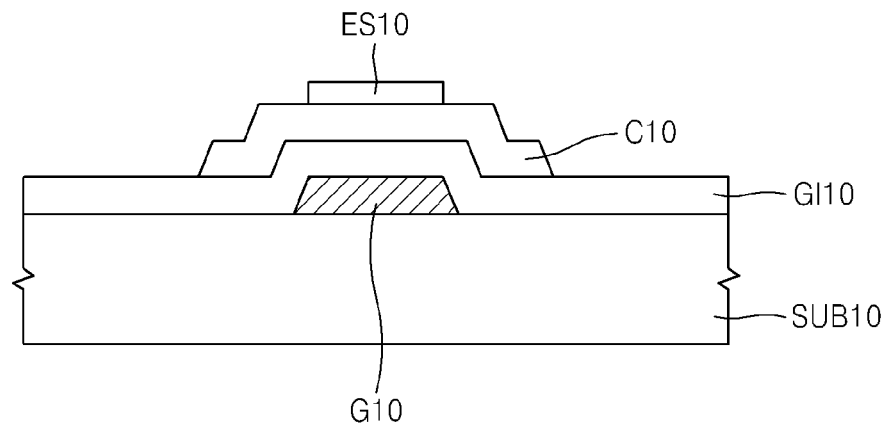

Referring to FIG. 16E, an etch-stop layer ES10 may be formed on the channel layer C10, according to at least one example embodiment. The etch-stop layer ES10 may be formed at or around a central portion of the channel layer C10. Accordingly, portions of the channel layer C10 on both sides of the etch-stop layer ES10 may not be covered by the etch-stop layer ES10 to be exposed. The etch-stop layer ES10 may be formed of, for example, silicon oxide, silicon oxynitride, silicon nitride, or an organic insulating material.

Figure 16F:
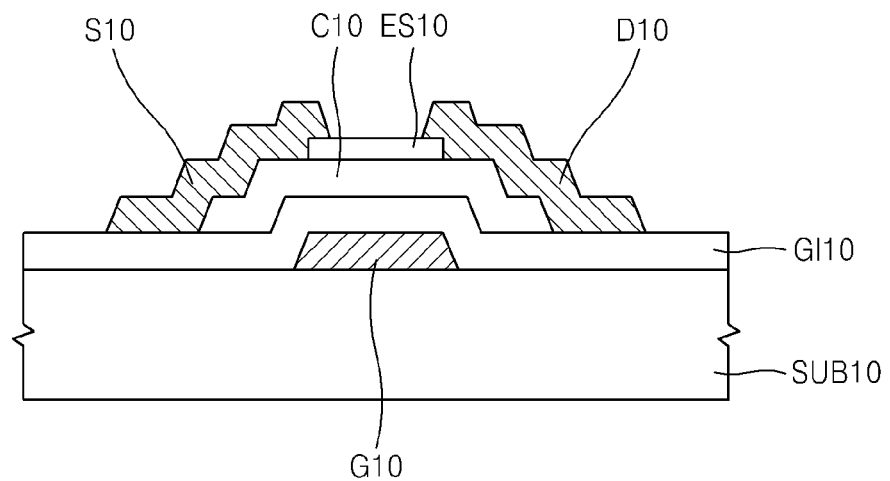

Referring to FIG. 16F, a source electrode S10 and a drain electrode D10 that respectively contact first and second regions (for example, both ends) of the channel layer C10 may be formed on the gate insulating layer GI10, according to at least one example embodiment. The source electrode S10 may have a structure that contacts the first region (one end) and extends over one end of the etch-stop layer ES10. The drain electrode D10 may have a structure that contacts the second region (the other end) and extends over the other end of the etch-stop layer ES10. A predetermined conductive film that covers the channel layer C10 and the etch-stop layer ES10 may be formed on the gate insulating layer GI10, and then the source electrode S10 and the drain electrode D10 may be formed by patterning (etching) the conductive film. In this case, the etch-stop layer ES10 may prevent the channel layer C10 from being damaged during an etching process for forming the source electrode S10 and the drain electrode D10. The source electrode S10 and the drain electrode D10 may each be formed of the same material as the gate electrode G10, or a different material than the gate electrode G10. The source electrode S10 and the drain electrode D10 may each be formed to have a single-layer structure or a multi-layer structure.

Figure 16G:
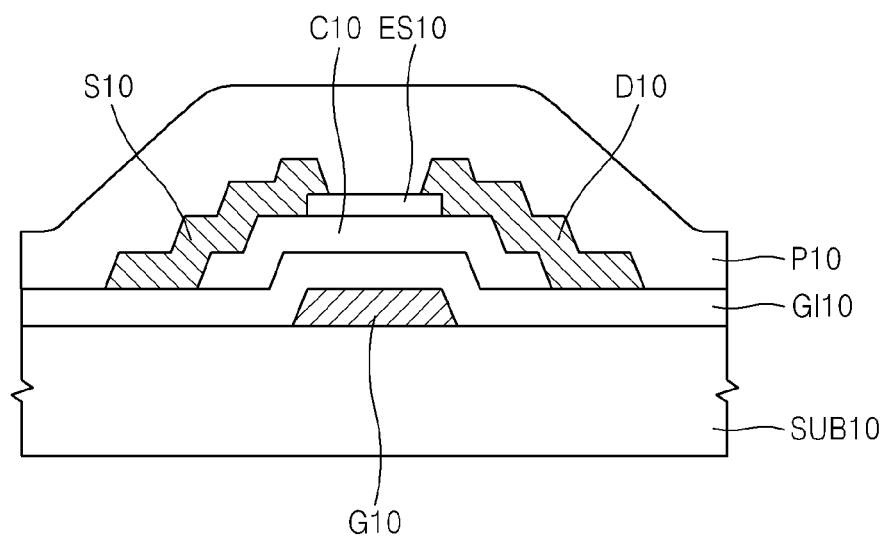

Referring to FIG. 16G, a passivation layer P10 that covers the etch-stop layer ES10, and the source electrode S10 and the drain electrode D10 may be formed on the gate insulating layer GI10, according to at least one example embodiment. The passivation layer P10 may be a silicon oxide layer, a silicon oxynitride layer, a silicon nitride layer, or an organic insulating layer, or may be formed to have a structure in which at least two layers from among a silicon oxide layer, a silicon oxynitride layer, a silicon nitride layer, and an organic insulating layer are stacked. Annealing may be performed before or after the passivation layer P10 is formed.

The method of FIGS. 16A through 16G is an example method of manufacturing the transistor of FIG. 11. The transistor of FIG. 12 may be manufactured by modifying the method of FIGS. 16A through 16G. For example, the source electrode S10 and the drain electrode D10 may be formed without forming the etch-stop layer ES10 of FIG. 16E. Whether to use the etch-stop layer ES10 may be determined according to a material of the channel layer C10 and materials of the source electrode S10 and the drain electrode D10. Alternatively, whether to use the etch-stop layer ES10 may be determined according to an etching process for forming the source electrode S10 and the drain electrode D10. Accordingly, in some cases, a subsequent process may be performed without the etch-stop layer ES10, and thus, the transistor of FIG. 12 may be manufactured. In addition, the method of FIGS. 16A through 16G may be changed in various ways.

FIGS. 17A through 17E are cross-sectional views for explaining a method of manufacturing a transistor, according to another example embodiment. The method of FIGS. 17A through 17E is an example method of manufacturing a TFT having a top gate structure.

Figure 17A:
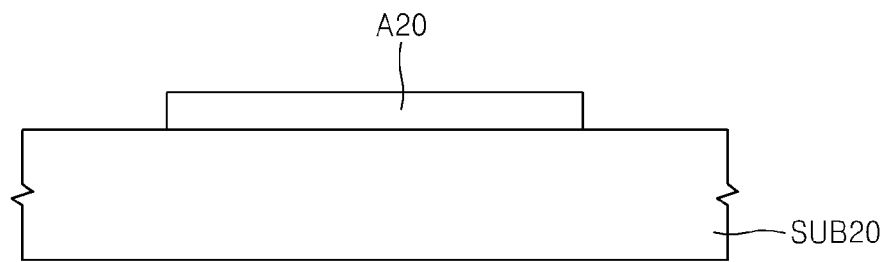
FIGS. 17A through 17E are cross-sectional views for explaining a method of manufacturing a transistor, according to another example embodiment.

Referring to FIG. 17A, an active layer A20 may be formed on a substrate SUB20, according to at least one example embodiment. The active layer A20 may be formed of a semiconductor according to an example embodiment. The active layer A20 may be formed by using any of the methods described with reference to FIGS. 3 through 10. Accordingly, the active layer A20 may be formed of a semiconductor including zinc, fluorine, oxygen, and nitrogen, or a semiconductor including zinc, fluorine, and nitrogen. In other words, the active layer A20 may be formed of a semiconductor including zinc fluorooxynitride, or a semiconductor including zinc fluoronitride. A thickness of the active layer A20 may range from about 10 nm to about 150 nm, for example, from about 20 nm to 100 nm. However, in some cases, an appropriate thickness range may be changed. A material, properties, characteristics, and modifications of the active layer A20 may be the same as or similar to those of the semiconductor films 100 and 100' of FIGS. 1 and 2.

Figure 17B:
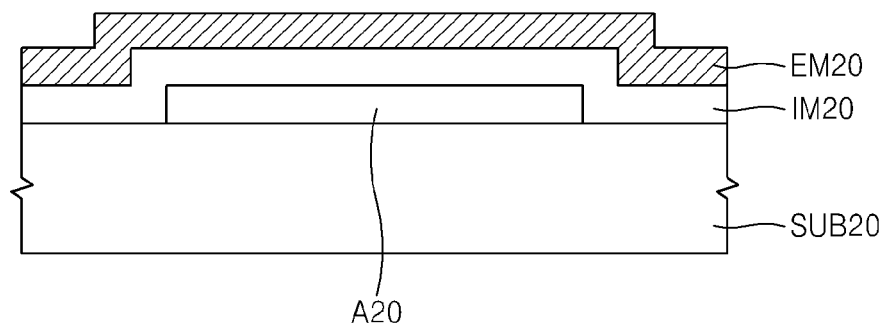

Referring to FIG. 17B, an insulating material layer IM20 that covers the active layer A20 may be formed on the substrate SUB20, according to at least one example embodiment. The insulating material layer IM20 may be formed of silicon oxide, silicon oxynitride, or silicon nitride, or may be formed of another material, for example, a high-k material having a dielectric constant higher than that of silicon nitride. The insulating material layer IM20 may be formed to have a structure in which at least two layers from among a silicon oxide layer, a silicon oxynitride layer, a silicon nitride layer, and a high-k material layer are stacked. In more detail, the insulating material layer IM20 may be formed of a silicon oxide layer, or may be formed to have a structure in which a silicon oxide layer and a silicon nitride layer are sequentially stacked. Next, an electrode material layer EM20 may be formed on the insulating material layer IM20.

Figure 17C:
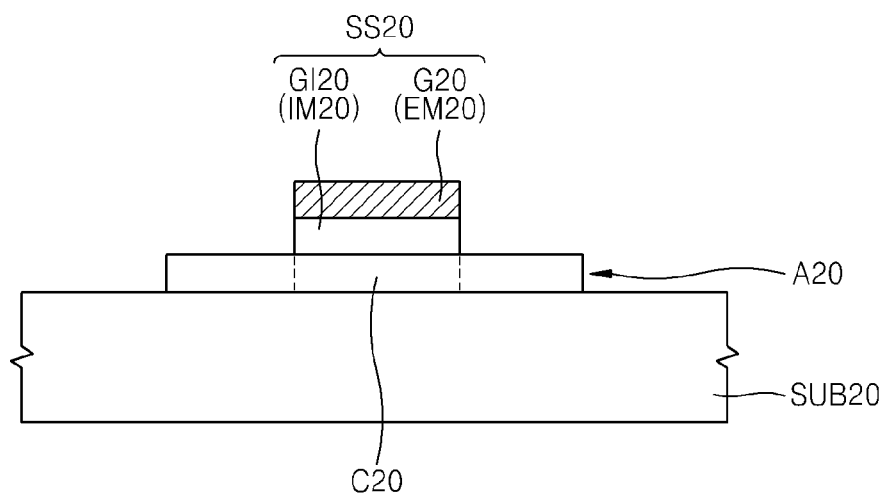

Referring to FIG. 17C, a stacked structure SS20 may be formed at or around a central portion of the active layer A20 by etching, or sequentially etching, the electrode material layer EM20 and the insulating material layer IM20, according to at least one example embodiment. A portion of the active layer A20 under the stacked structure SS20 may be the channel region C20. In FIG. 17C, reference numeral GI20 denotes an etched insulating material layer (hereinafter, referred to as a gate insulating layer), and G20 denotes an etched electrode material layer (hereinafter, referred to as a gate electrode).

Figure 17D:
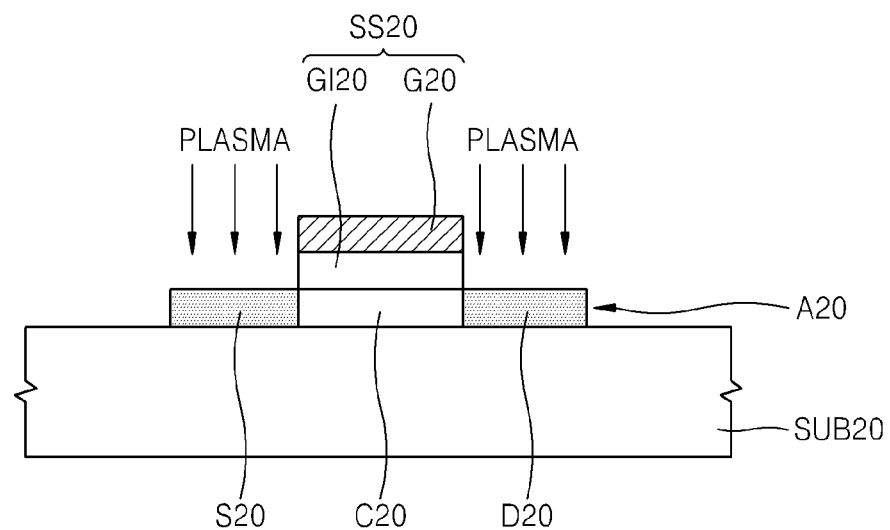

Referring to FIG. 17D, a source region S20 and a drain region D20 may be formed in the active layer A20 at both sides of the stacked structure SS20 by treating (processing) the active layer A20 at both sides of the stacked structure SS20 with plasma, according to at least one example embodiment. The plasma may be, for example, plasma of a gas including hydrogen (H). The gas including the hydrogen (H) may be $NH_3$, $H_2$, $SiH_4$, or the like. When both end portions of the active layer A20 are treated (processed) by using the plasma of the gas including the hydrogen, the hydrogen may act as a carrier by entering the active layer A20. Also, the plasma of the hydrogen may remove an anion (oxygen or the like) of the active layer A20, and thus, an electrical conductivity of a plasma-treated region may be increased. Thus, the source region S20 and the drain region D20 may each include a region which anion (oxygen or the like) concentration is relatively low. In other words, the source region S20 and the drain region D20 may each include a region which cation concentration is relatively high, for example, a zinc-rich region. The method of forming the source region S20 and the drain region D20 is an example, and may be changed in various ways.

Figure 17E:
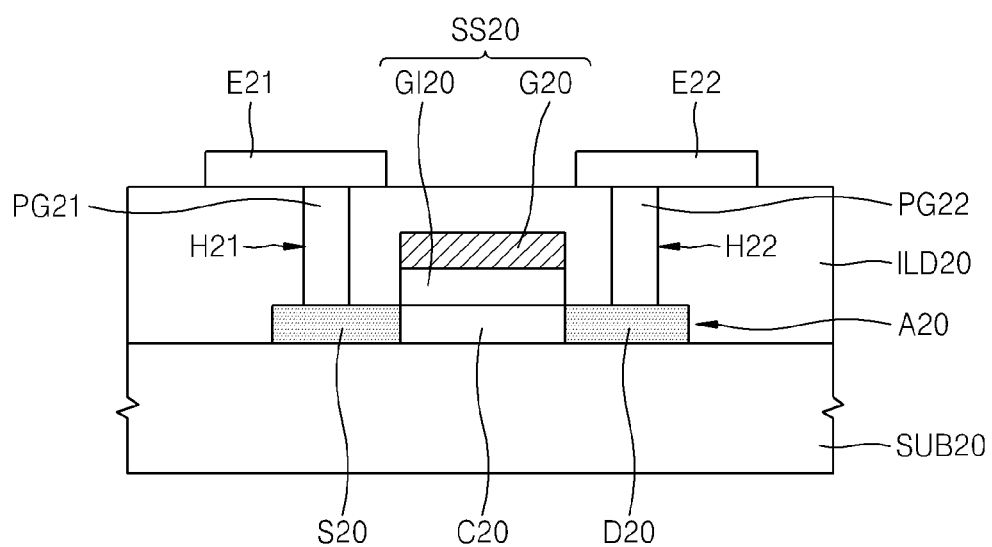

Referring to FIG. 17E, an interlayer insulating layer ILD20 that covers the stacked structure SS20, and the source region S20 and the drain region D20 may be formed on the substrate SUB20, according to at least one example embodiment. First and second contact holes H21 and H22 through which the source region S20 and the drain region D20 are exposed may be formed by etching the interlayer insulating layer ILD20, and the first conductive plug PG21 and the second conductive plug PG22 may be respectively formed in the first and second contact holes H21 and H22. Next, the first electrode E21 that contacts the first conductive plug PG21 and the second electrode E22 that contacts the second conductive plug PG22 may be formed on the interlayer insulating layer ILD20. Next, although not shown in FIG. 17E, a passivation layer that covers the first and second electrodes E21 and E22 may be further formed on the interlayer insulating layer ILD20. Annealing (i.e., performing heat treatment on) the substrate SUB20 at a predetermined temperature in order to improve characteristics of a device may be further performed before or after the passivation layer is formed.

The method of FIGS. 17A through 17E is an example method of manufacturing the transistor of FIG. 13. The transistor of FIG. 14 may be manufactured by modifying the method of FIGS. 17A through 17E. For example, the source/drain regions S20' and D20' of FIG. 14 may be formed by performing a first plasma treating on the active layer A20 at both sides of the stacked structure SS20 in the operation of FIG. 17D, forming an insulating spacer on both side walls of the stacked structure SS20, and performing a second plasma treating on the active layer A20 at both sides of the stacked structure SS20 and the insulating spacer. Next, the transistor as shown in FIG. 14 may be manufactured by performing a subsequent process. In addition, the method of FIGS. 17A through 17E may be changed in various ways.

Figure 18A:
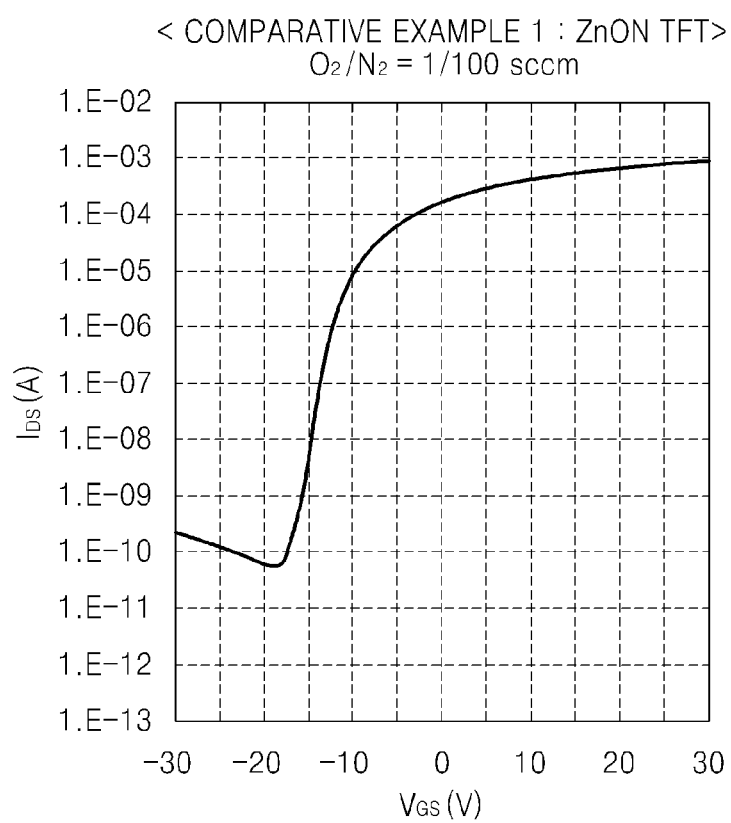
FIGS. 18A through 18C are graphs illustrating transfer characteristics of thin film transistors (TFTs) using semiconductor films as channel layers, according to comparative examples.
Figure 18B:
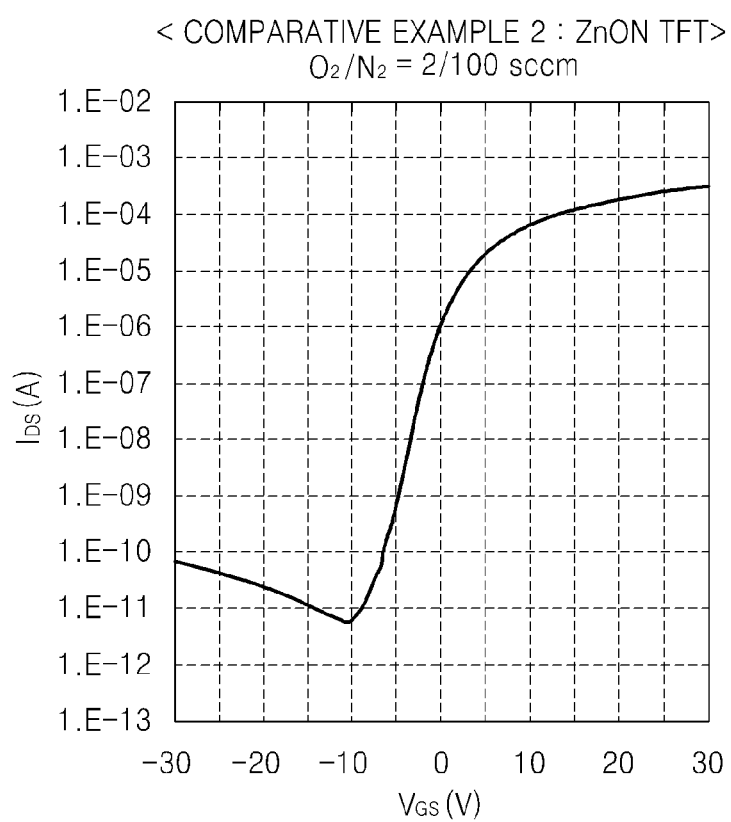
Figure 18C:
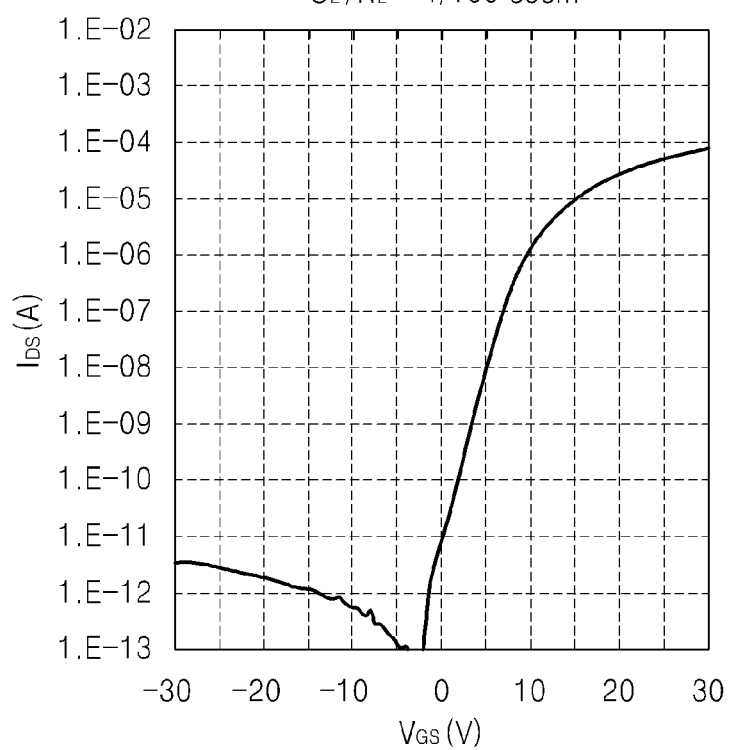

FIGS. 18A through 18C are graphs illustrating transfer characteristics of TFTS using semiconductor films (ZnON films) as channel layers, according to comparative examples. Transfer characteristics correspond to a relationship between a drain current IDS and a gate voltage VGS. The semiconductor films (ZnON films) according to the comparative examples are formed by using sputtering as described with reference to FIG. 3 and by changing a flow rate ratio of an oxygen gas ($O_2$) and a nitrogen gas ($N_2$) without using a fluorine-containing gas. When the semiconductor film of the TFT according to a comparative example 1 of FIG. 18A is formed, a flow rate ratio of the oxygen gas to the nitrogen gas is 1/100 sccm. When the semiconductor film of the TFT according to a comparative example 2 of FIG. 18B is formed, a flow rate ratio of the oxygen gas to the nitrogen gas is 2/100 sccm. When the semiconductor film of the TFT according to a comparative example 3 of FIG. 18C is formed, a flow rate ratio of the oxygen gas to the nitrogen gas is 4/100 sccm. Accordingly, a ratio of oxygen to nitrogen in the semiconductor film increases as shown from the comparative example 1 to the comparative example 3. When the semiconductor films according to the comparative examples 1 through 3 are formed, sputtering power for a zinc target is 300 W, and a pressure of a reaction chamber is 0.4 Pa.

Figure 19A:
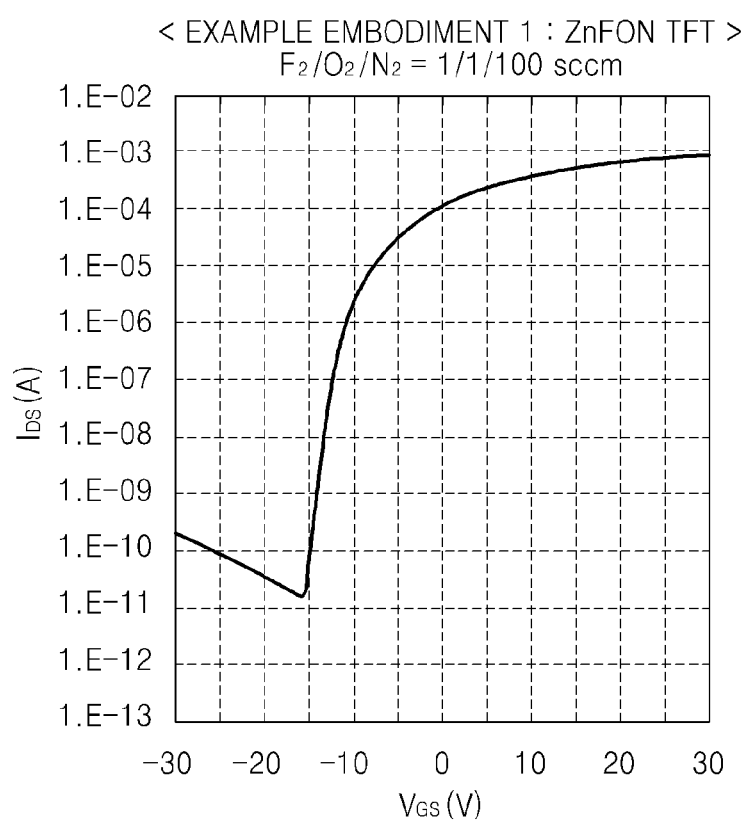
FIGS. 19A and 19B are graphs illustrating transfer characteristics of TFTs using semiconductor films as channel layers, according to example embodiments.
Figure 19B:
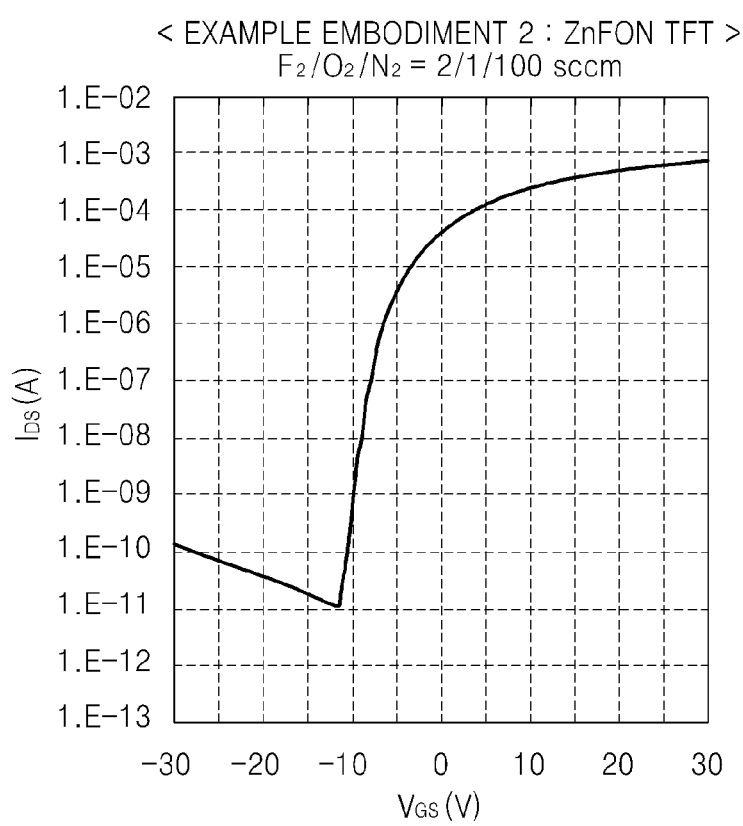

FIGS. 19A through 19B are graphs illustrating transfer characteristics of TFTs using semiconductor films (ZnFON films) as channel layers, according to example embodiments. The semiconductor films (ZnFON films) according to the example embodiments are formed by using sputtering as described with reference to FIG. 3 and by changing a flow rate ratio of a fluorine gas ($F_2$) to an oxygen gas ($O_2$) to a nitrogen gas ($N_2$). When the semiconductor film of the TFT according to an embodiment 1 of FIG. 19A is formed, a flow rate ratio of the fluorine gas to the oxygen gas to and the nitrogen gas is 1/1/100 sccm. When the semiconductor film of the TFT according to an example embodiment 2 of FIG. 19B is formed, a flow rate ratio of the fluorine gas to the oxygen gas to the nitrogen gas is 2/1/100 sccm. Accordingly, a content ratio of fluorine of the semiconductor film of the embodiment 2 is higher than that of the example embodiment 1. A content ratio of fluorine to the sum of zinc, oxygen, nitrogen, and fluorine of the semiconductor film of the example embodiment 1 is about 3 at %, and a content ratio of fluorine to the sum of zinc, oxygen, nitrogen, and fluorine of the semiconductor film of the example embodiment 2 is about 5 at %. When the semiconductor films according to the example embodiments 1 and 2 are formed, sputtering power for a zinc target is 300 W, and a pressure of a reaction chamber is 0.4 Pa. The sputtering power and pressure conditions are the same as those of the comparative example 1 through the comparative example 3.

Table 1 shows a field-effect mobility ($cm^2$/Vs) and a sub-threshold swing value (V/dec) of each of the TFTs of FIGS. 18A through 18C and FIGS. 19A and 19B.

TABLE 1

|  | Field-effect Mobility (μ) [$cm^2$/Vs] | Subthreshold swing (S.S.) [V/dec] |
| --- | --- | --- |
| Comparative example 1 (FIG. 18A) | 93.2 ± 2.8 | 0.90 ± 0.04 |
| Comparative example 2 (FIG. 18B) | 60.6 ± 4.4 | 1.23 ± 0.02 |
| Comparative example 3 (FIG. 18C) | 17.9 ± 0.5 | 1.58 ± 0.05 |
| Embodiment 1 (FIG. 19A) | 87.1 ± 2.6 | 0.58 ± 0.06 |
| Embodiment 2 (FIG. 19B) | 81.3 ± 1.0 | 0.53 ± 0.01 |

Referring to Table 1, each of the TFTs according to example embodiment 1 and example embodiment 2 has a field-effect mobility higher than 80 $cm^2$/Vs and a sub-threshold swing (S.S.) value lower than 0.6 V/dec. Considering that a field-effect mobility increases and a subthreshold swing (S.S.) value decreases, the performance (ON/OFF switching characteristics, etc.) of a TFT is improved, it is found that each of the TFTs according to example embodiments 1 and 2 has improved performance. Considering that when a mobility, that is, a field-effect mobility, of a TFT is equal to or greater than about 10 cm2/Vs (or about 20 cm2/Vs), the TFT may be appropriately applied to a high-speed and high-resolution display apparatus, each of the TFTs according to example embodiments 1 and 2 may be easily applied to a high-sped and high-performance electronic device (display apparatus).

The TFT according to the comparative example 1 (FIG. 18A) has a drawback in that, although a field-effect mobility is relatively high, a subthreshold swing (S.S.) value is high. When a subthreshold swing (S.S.) value is high, it means that ON/OFF switching characteristics are not good. Also, it is found that as a ratio of oxygen to nitrogen in a channel layer (ZnON layer) increases as shown from FIG. 18A to FIG. 18C, a mobility of the TFT decreases and a subthreshold swing (S.S.) value further increases. Accordingly, it may be difficult for the semiconductor films (ZnON films) according to the comparative examples 1 through 3 to have both a high mobility and excellent ON/OFF switching characteristics.

Referring back to FIGS. 19A and 19B, it is found that an ON current is about $10^{-3}$ A, an OFF current is equal to or less than $10^{-10}$ A, and an ON/OFF current ratio is relatively high, such as about $10^7$ or more. Accordingly, it is found that a TFT according to the present example embodiment has a low OFF current, a high ON/OFF current ratio, and excellent characteristics as a transistor. In particular, as a content ratio of fluorine of a semiconductor film (channel layer) increases, a slope between ON and OFF states gradually increases. This means that as a content ratio of fluorine of a semiconductor film (channel layer) increases, a subthreshold swing (S.S.) value decreases and ON/OFF switching characteristics are improved. When a content ratio of fluorine of a semiconductor film increases, a carrier density of the semiconductor film may be appropriately controlled and a subthreshold swing (S.S.) value of a transfer curve may decrease. If a content ratio of fluorine of a semiconductor film increases, nitrogen vacancies in the semiconductor film may decrease, and thus a subthreshold swing (S.S.) value may decrease.

Transistors according to example embodiments may be applied as a switching device or a driving device to a display apparatus such as an organic light-emitting display apparatus or a liquid crystal display apparatus. As described above, since the transistor has a high mobility, a low swing value, a low OFF current, and excellent switching characteristics (ON/OFF characteristics), the performance of a display apparatus may be improved when the transistor is applied to the display apparatus. Accordingly, the transistor may be effectively used to realize a next generation high-performance/high-resolution/large-size display apparatus. Also, the transistor may be applied for various purposes to other electronic devices such as a memory device or a logic device as well as a display apparatus. For example, the transistor may be used as a transistor constituting a peripheral circuit of a memory device or a selection transistor.

Figure 20:
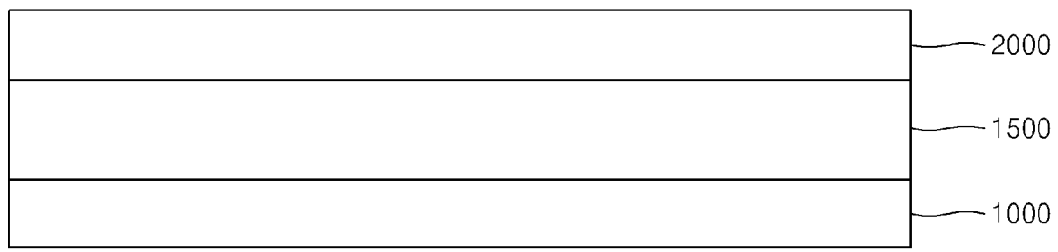
FIG. 20 is a cross-sectional view illustrating an electronic device (display apparatus) including a transistor, according to an example embodiment.

FIG. 20 is a cross-sectional view illustrating an electronic device including a transistor, according to an example embodiment. The electronic device of FIG. 20 is a display apparatus.

Referring to FIG. 20, an intermediate element layer 1500 may be disposed between a first substrate 1000 and a second substrate 2000. The first substrate 1000 may be an array substrate including a transistor according to an example embodiment, for example, at least one of the transistors of FIGS. 11 through 15, which acts as a switching device or a driving device. The second substrate 2000 may be a substrate facing the first substrate 1000. A configuration of the intermediate element layer 1500 may vary according to a type of the display apparatus. When the display apparatus is an organic light-emitting display apparatus, the intermediate element layer 1500 may include an "organic light-emitting layer". When the display apparatus is a liquid crystal display apparatus, the intermediate element layer 1500 may include a "liquid crystal layer". Also, when the display apparatus is a liquid crystal display apparatus, a backlight unit (not shown) may be further disposed under the first substrate 1000. A configuration of the electronic device including the transistor is not limited to the structure of FIG. 20, and may be changed in various ways.

While the example embodiments have been particularly shown and described with reference to examples thereof, it will be understood by one of ordinary skill in the art that various changes in form and details may be made therein without departing from the spirit and scope of the example embodiments as defined by the following claims. For example, it will be understood by one of ordinary skill in the art that elements and structures of the transistors of FIGS. 11 through 15 may be changed in various ways. In detail, a channel layer may be formed to have a multi-layer structure, and in this case, at least one of a plurality of layers constituting the channel layer may be formed of the semiconductor film 100 or 100' of FIG. 1 or 2. Also, the transistors according to the one or more example embodiments may each have a double-gate structure. The methods of FIGS. 16A through 16G and 17A through 17E may be changed in various ways. Also, the transistors according to the one or more example embodiments may be applied for various purposes to various electronic devices as well as to the display apparatus of FIG. 20. Accordingly, the scope of the example embodiments is defined not by the one or more examples but by the appended claims.

What is claimed is:

1. A method of forming a semiconductor film by using reactive sputtering, the method comprising:
   forming the semiconductor film comprising zinc (Zn), nitrogen (N), and fluorine (F) by using a zinc target and a reactive gas comprising at least one of nitrogen and fluorine,
   wherein the semiconductor film comprises zinc fluoronitride (ZnFN),
   wherein a content ratio of fluorine with respect to the sum of nitrogen and fluorine in the semiconductor film is in a range of 3 at% to 45 at%;
   wherein a content ratio of nitrogen with respect to the sum of nitrogen and fluorine in the semiconductor film is 55 at% or greater: and
   wherein the ZnFN of the semiconductor film has a Hall mobility equal to or greater than 10 cm$^2$/Vs.

2. The method of claim 1, wherein the reactive gas comprises a fluorine-containing gas, and wherein the fluorine-containing gas comprises at least one of F2, NF3, SF6, and CF4.

3. The method of claim 1, wherein the reactive gas comprises a nitrogen-containing gas, and wherein the nitrogen-containing gas comprises at least one of N2, N2O, and NH3.

4. The method of claim 1, wherein the reactive gas comprises an oxygen-containing gas, and wherein the oxygen-containing gas comprises at least one of O2, H2O, and N2O.

5. A method of manufacturing a transistor comprising a channel layer including a semiconductor, a gate electrode being spaced apart from the channel layer, and a source and a drain respectively contacting first and second regions of the channel layer, the method comprising:
   forming the channel layer, the forming the channel layer including forming the semiconductor film via the method of claim 1.

6. A method of forming a semiconductor film by using reactive sputtering, the method comprising:
   forming the semiconductor film comprising zinc (Zn), nitrogen (N), fluorine (F), and oxygen (O) by using a zinc target and a reactive gas comprising nitrogen, fluorine, and oxygen,
   wherein the semiconductor film comprises zinc fluorooxynitride (ZnFON),
   wherein a content ratio of fluorine with respect to the sum of nitrogen, fluorine and oxygen in the semiconductor film is in a range of 3 at% to 35 at%;

wherein a content ratio of nitrogen with respect to the sum of nitrogen, fluorine and oxygen in the semiconductor film is 50 at% or greater;

wherein a content ratio of oxygen with respect to the sum of nitrogen, fluorine and oxygen in the semiconductor film is 40 at% or less; and wherein the ZnFON of the semiconductor film has a Hall mobility equal to or greater than 10 cm$^2$/Vs.

7. A method of manufacturing a transistor comprising a channel layer including a semiconductor, a gate electrode spaced apart from the channel layer, and a source and a drain respectively contacting first and second regions of the channel layer, the method comprising:

forming the channel layer, the forming of the channel layer including forming the semiconductor film via the method of claim 6.

\* \* \* \* \*